United States Patent [19]
Yamamoto et al.

[11] Patent Number: 5,434,453
[45] Date of Patent: Jul. 18, 1995

[54] SEMICONDUCTOR INTEGRATED CIRCUIT DEVICE AND COMPUTER SYSTEM USING THE SAME

[75] Inventors: Kazumichi Yamamoto, Hachioji; Keiichirou Nakanishi, Tokyo, both of Japan; Moritoshi Yasunaga, Pittsburgh, Pa.; Tatsuya Saitoh; Katsunari Shibata, both of Kokubunji, Japan; Minoru Yamada, Hanno, Japan; Noboru Masuda, Kokubunji, Japan

[73] Assignee: Hitachi, Ltd., Tokyo, Japan

[21] Appl. No.: 872,296

[22] Filed: Apr. 22, 1992

[30] Foreign Application Priority Data

Apr. 26, 1991 [JP] Japan ................... 3-096788
Feb. 3, 1992 [JP] Japan ................... 4-017452

[51] Int. Cl.$^6$ ............... H01L 23/48; H01L 29/40
[52] U.S. Cl. ................... 257/777; 257/778; 327/565
[58] Field of Search ............... 257/777, 778, 909; 327/154, 166, 233, 252, 253, 565

[56] References Cited

U.S. PATENT DOCUMENTS

| 4,021,838 | 3/1977 | Warnick | 257/777 |
| 4,467,342 | 8/1984 | Tower | 257/777 |
| 4,675,717 | 6/1987 | Herrero et al. | 257/777 |
| 5,016,087 | 5/1991 | Haug et al. | 257/723 |
| 5,049,972 | 9/1991 | Uda et al. | 257/758 |

FOREIGN PATENT DOCUMENTS

| 58-154254 | 9/1983 | Japan . |
| 1-120046 | 5/1989 | Japan . |
| 2-60156 | 2/1990 | Japan . |
| 2-181465 | 7/1990 | Japan . |
| 3-69150 | 3/1991 | Japan . |
| 3093259 | 4/1991 | Japan ................... 257/777 |

OTHER PUBLICATIONS

IBM TDB, vol. 31, No. 10, Mar. 1989 Method of Improving The Density of VLSI Chips By Using a Wiring Chip.
IBM TDB vol. 32, No. 1, Jun. 1989 Partitioning Function and Packaging of ICs for Physical Security of Data pp. 46–49.
IBM TDB vol. 31, No. 10, Mar. 1989 Silicon, Elevated, Wireless Module Method for Making Engrg Changes pp. 71–74.
IBM TDB vol. 8, No. 11, Apr. 1966 Metal Contacts for Semiconductor Structures p. 1684.
IBM TDB vol. 23, No. 7A, Dec. 1980 Flip Chip on Personalization Chip Corner Package, Motika, pp. 2770–2773.
Yanai et al., Revised Integrated Circuit Engineering, p. 218.
Yanai et al., Revised Integrated Circuit Engineering, pp. 214–217, 220–221.
Brogman et al., "A Thin Film Multichip Module for Workstation Applications", 42nd Proceedings of Electronic Components Technology Conference, May 1991, pp. 968–972.
Tewksbury, "Silicon Wafer Hybrids", Wafer Level Integrated Systems: Implementation Issues, pp. 387–391.
"Processing System and Hardware Technique of Large Scale Computer M-880", Nikkei Electronics, Dec. 10, 1990 (No. 515), pp. 209–241.
A Hypercube Design on Wafer-Scale Integration by Hide Ito et al., pp. 314–313.
Nikkei Electronics 1987. 6.1 (No. 422) pp. 141–161.

*Primary Examiner*—Edward Wojciechowicz
*Assistant Examiner*—Teresa M. Arroyo
*Attorney, Agent, or Firm*—Fay, Sharpe, Beall, Fagan, Minnich & McKee

[57] ABSTRACT

A semiconductor integrated circuit device includes a plurality of integrated circuit chips and a large-sized integrated circuit element on which the plurality of integrated circuit chips are mounted. The large-sized integrated circuit element includes a logic circuit for electrically interconnecting the integrated circuit chips mounted on it. The logic circuit provided within the large-sized integrated circuit element includes a control circuit for controlling a connection relation between the integrated circuit chips mounted on the large-sized integrated circuit element. Further, the logic circuit includes buffer or latch circuits for relaying signals transmitted between the integrated circuit chips.

18 Claims, 19 Drawing Sheets

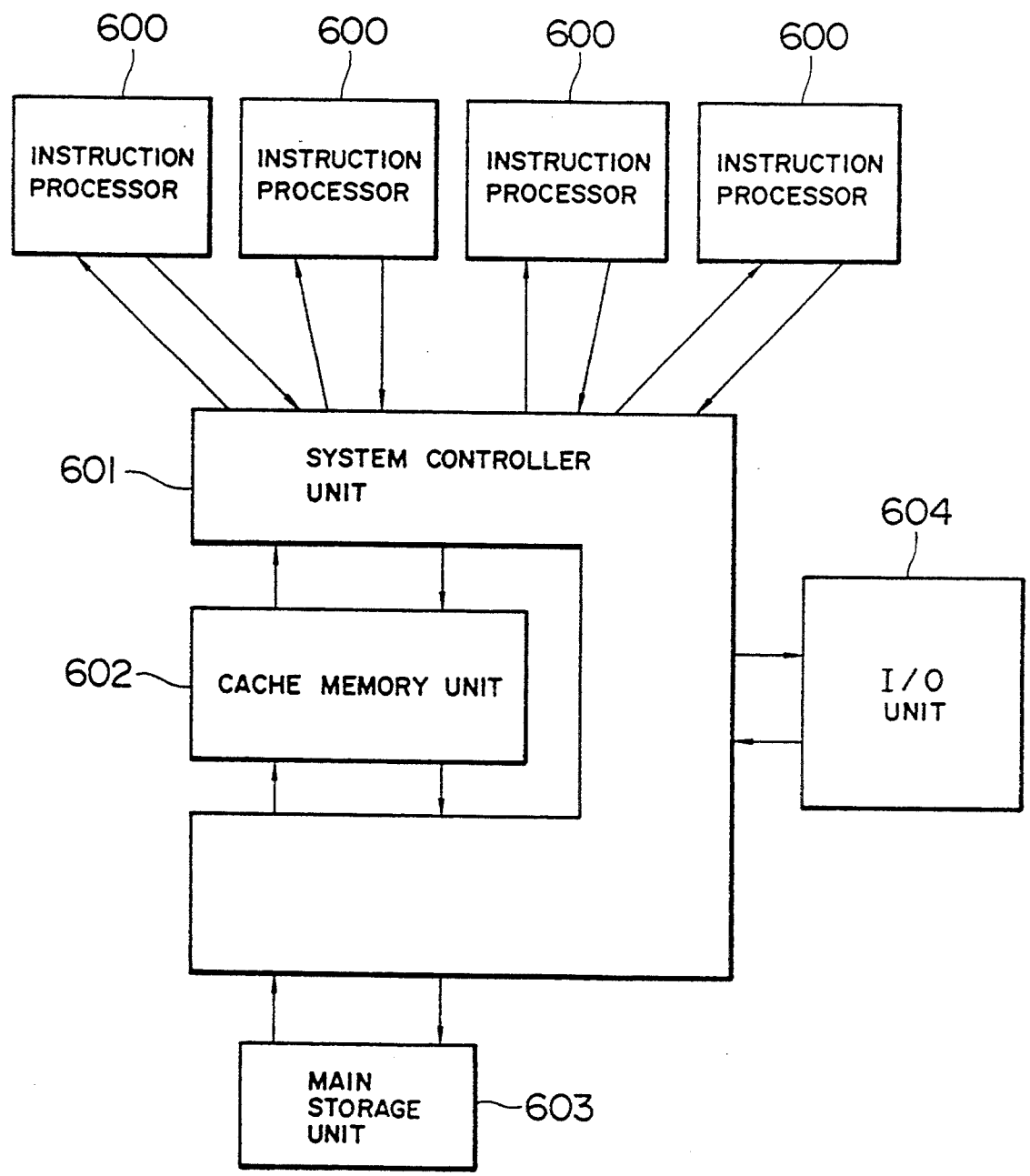

SEMICONDUCTOR INTEGRATED CIRCUIT DEVICE AND COMPUTER SYSTEM USING THE SAME

BACKGROUND OF THE INVENTION

The present invention relates to a semiconductor integrated circuit device, and more particularly to a semiconductor integrated circuit device having a plurality of semiconductor integrated circuit chips mounted on a large-sized integrated circuit chip and capable of attaining high-density packaging with high yield, and to a computer system using the semiconductor integrated circuit device.

A packaging technique in a large-scale general-purpose computer or the like involves, for example, as described in the paper "PROCESSING SYSTEM AND HARDWARE TECHNIQUE OF LARGE SCALE COMPUTER M-880" Nikkei Electronics, Dec. 10, 1990 (No. 515), pp. 209-241, a technique in which a plurality of LSI chips are mounted on a ceramic wiring substrate (module) in face down fashion and the LSI chips are connected to one another or to external circuit devices outside of the module through solder bumps and the ceramic wiring substrate (this packaging technique is hereinafter referred to as a module packaging technique in the specification).

In tile module packaging technique, transmission of signals between the LSI chips on the ceramic wiring substrate is made by matched impedance transmission using terminating resistors in order to prevent the signals from being reflected at the of wiring ends. The terminating resistors are required in each wiring. The terminating resistors dissipate electric power regardless of the signal transmission and hence substantially large electric power is dissipated by the terminating resistors in the whole module.

Further, the pitch of terminals in the module cannot be made too small because of the strength of connection between the ceramic substrate and the terminals. Accordingly, there is an increased pin problem in that the number of terminals cannot be secured sufficiently as the scale or the number of circuits mountable on one module is increased.

On the other hand, a method using wafer scale integration circuit (hereinafter referred to as WSI) is known in order to realize a large scale integrated circuit device as compared with the module packaging technique. The WSI is used to integrate a plurality of LSI chips on the same wafer and make wiring among the LSI chips on the same wafer, so that connection terminals are not required to thereby lighten the burden on the packaging, and high-density packaging can thus be expected as compared with the module packaging technique. However, the WSI has a problem that a defect occurring in the process stage necessarily exists with a certain probability (problem as to a so-called yield). Thus, even if circuits are integrated with high density on the WSI, the probability that the circuits are operated successfully is very low. Accordingly, it is necessary to avoid or remedy the defect occurring in the process stage. In this respect, a method has been studied in which redundant logic circuits are provided previously in the design process and a portion in which a defect has been found is replaced by a separate normal logic circuit (so-called monolithic type wafer scale integration circuit).

Further, Japanese Patent Unexamined Publication No. 2-181465 discloses a method in which a plurality of chips which are confirmed to be operated successfully by previously implemented inspection are fixedly mounted vertically on a wafer to improve the yield as a system of combined wafer and chips (so-called hybrid type wafer scale integration circuit). This method can advantageously make a wiring pitch very much narrower as compared with the mounting of chips on the substrate and improve the packaging density.

However, wiring formed to connect among the chips on the wafer in the WSI is relatively long in distance, and thus wiring resistance is increased. In general, the propagation delay time of a signal propagated on the wiring formed on the integrated circuit chip is determined by a product of the wiring resistance and the wiring capacitance. Accordingly, as the wiring resistance is increased, the propagation delay time is also increased.

Additionally, Japanese Patent Unexamined Publication No. 3-69150 discloses a mounting structure for LSI chips in which a first LSI chip is mounted by second LSI chips smaller than the first LSI chip and both of them are connected to each other. In this method, the wiring distance between the first LSI chip and the second LSI chips can be made short and signals can be propagated at high speed. However, when the number of LSI chips is further increased, it is difficult to propagate signals among the LSI chips at high speed.

SUMMARY OF THE INVENTION

It is an object of the present invention to provide a semiconductor integrated circuit device capable of transmitting a signal at high speed without use of the matched impedance transmission using a terminating resistor in a prior art module packaging technique.

It is another object of the present invention to provide a semiconductor integrated circuit device capable of solving a so-called pin problem and dealing with increase of the circuit scale easily while ensuring the yield.

It is still another object of the present invention to provide a semiconductor integrated circuit device suitable for configuration of an information processing apparatus such as a general-purpose digital computer system including a plurality of processors.

In order to achieve the above objects, the semiconductor integrated circuit device of the present invention comprises a plurality of integrated circuit chips and a large-sized integrated circuit element or chip on which the plurality of integrated circuit chips are mounted. The large-sized integrated circuit element includes a logic circuit for interconnecting the plurality of integrated circuit chips mounted on the large-sized integrated circuit element.

Wiring formed in the large-sized integrated circuit element is preferably formed thicker than wiring formed in tile integrated circuit chips mounted on the large-sized integrated circuit element. The thicker wiring is made of, for example, copper and is formed in the plating process. The logic circuit in the large-sized integrated circuit element includes buffer or latch circuits for relaying a signal transmitted between the integrated circuit chips. Further, the circuit scale of the logic circuit provided in the large-sized integrated circuit element is limited to be substantially equal to or smaller than that of a logic circuit in the integrated circuit chip mounted on the large-sized integrated circuit element.

Since the logic circuit formed in the large-sized integrated circuit element can divide wiring between the integrated circuit chips to the extent that the matched impedance transmission is not required, eliminating the necessity of the terminating resistor, a semiconductor device having reduced power dissipation can be realized. Further, since wiring in the large-sized integrated circuit element is formed thick, the wiring resistance can be made low and high-speed signal transmission can be attained. In addition, by making the scale of the logic circuit in the large-sized integrated circuit element approximately equal to or smaller than the scale of the logic circuit in the integrated circuit chip, the yield of the large-sized integrated circuit element can be secured.

BRIEF DESCRIPTION OF THE DRAWINGS

FIG. 6 is a block diagram schematically illustrating a configuration of a multi-processor type general-purpose computer system;

DESCRIPTION OF THE PREFERRED EMBODIMENTS

Figure 1:
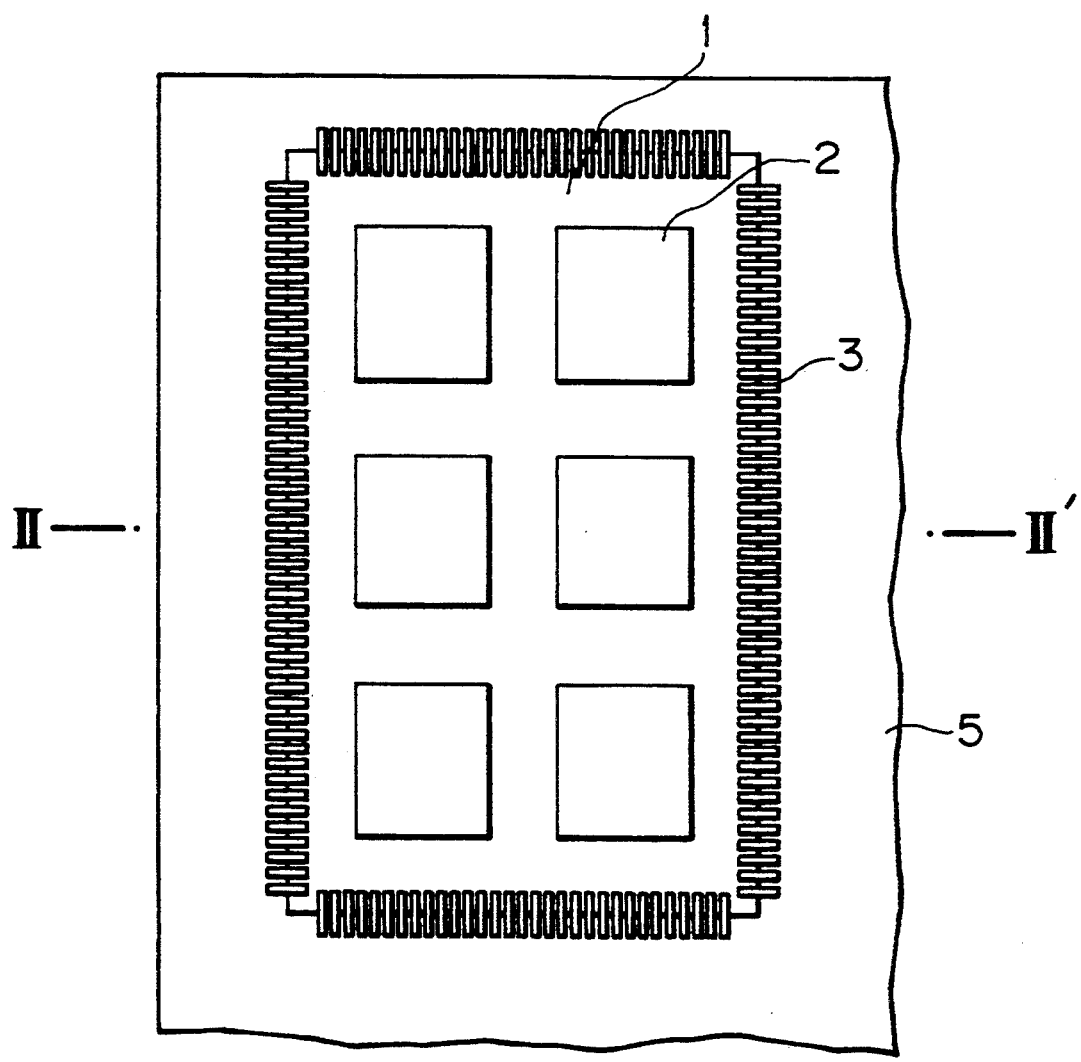
FIG. 1 schematically illustrates an embodiment of a semiconductor integrated circuit device according to the present invention.
Figure 2:
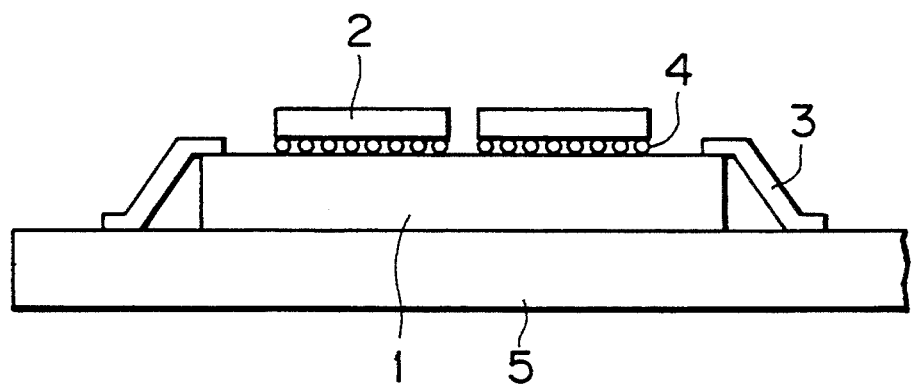
FIG. 2 is a sectional view of the integrated circuit device taken along line II-II' of FIG. 1.

FIG. 1 schematically illustrates a semiconductor integrated circuit device according to an embodiment of the present invention, and FIG. 2 is a sectional view of the semiconductor integrated circuit device taken along line II-II' of FIG. 1.

In FIGS. 1 and 2, numeral 1 denotes a large-sized integrated circuit element or chip having circuit elements formed therein as described later. Mounted on a main surface of the large-sized integrated circuit element 1 are, for example, six integrated circuit chips 2 in face down fashion. The circuit elements formed in the large-sized integrated circuit element 1 are electrically connected to circuit elements formed in the integrated circuit chips 2 by means of solder bumps if necessary. The integrated circuit chips 2 are of the usually available type and have a size of, for example, 20 mm square. The large-sized integrated circuit element 1 has a main surface having a large area of, for example, 50 mm×70 mm in order to mount the plurality of integrated circuit chips 2.

The large-sized integrated circuit element 1 is mounted on a wiring substrate 5 made of ceramic or the like and the circuit elements formed in the large-sized integrated circuit element 1 are electrically connected to wiring formed on the wiring substrate 5 by means of TAB (tape automated bonding) leads 3.

The number of circuit elements formed in the large-sized integrated circuit element 1 is substantially equal to or smaller than the number of circuit elements integrated in one of the integrated circuit chips 2 mounted thereon. For example, when it is assumed that defects are uniformly distributed in a logic circuit formed in the integrated circuit element, the probability of occurrence of a failure in the logic circuit formed in the integrated circuit element is increased as the size (area of the main surface) of the integrated circuit element is increased in the case where circuit elements are formed in the integrated circuit element with the same density. On the contrary, as in the present embodiment, by limiting the number of circuit elements formed in the large-sized integrated circuit element to be equal to or smaller than the number of circuit elements formed in the integrated circuit chips 2 mounted thereon, the probability of occurrence of a failure in the logic circuit formed in the large-sized integrated circuit element can be made equal to or smaller than that of occurrence of a failure in the logic circuit in the integrated circuit chips 2. Further, as described above, the large-sized integrated circuit element 1 has an area at least twice as large as that of the integrated circuit chip 2. Accordingly, the number of circuit elements per unit area of the logic circuit formed in the large-sized integrated circuit element 1 is smaller than that of the logic circuit formed in the integrated circuit chip 2. Restriction to a width of wiring or an interval of wiring formed in the large-sized integrated circuit element 1 can be loosened as compared with the integrated circuit chip 2 to thereby secure the yield even in the semiconductor integrated circuit device having a large area.

As described so far, in the present embodiment, an integrated circuit element having a size of, for example, 50 mm×70 mm is used as the large-sized integrated circuit element 1. A semiconductor integrated circuit device having such a large area requires longer wiring as compared with wiring within an integrated circuit chip having a commonly used size, that is, longer wiring than, for example, a length of a diagonal line of integrated circuit chip 2. In other words, it is necessary to form in the integrated circuit element long wiring which has been formed in a ceramic wiring substrate or a printed wiring board by the conventional module packaging technique.

Usually, wiring formed in an integrated circuit chip is minute aluminum wiring and has a larger wiring resistance per unit length as compared with wiring formed in a ceramic wiring substrate or a printed wiring board. Accordingly, when the minute aluminum wiring is used to form long-distance wiring in a large-sized integrated circuit element such as the large-sized integrated circuit element 1 in the embodiment, its wiring resistance is larger than the wiring resistance of the conventionally used ceramic wiring substrate or printed wiring board. Further, since the propagation delay time in the wiring portion is determined by a product of the wiring resistance and the wiring capacitance, the propagation delay time is also increased in the minute aluminum wiring. Accordingly, when only the minute aluminum wiring is used as the wiring in the integrated circuit element having a large area, performance of the logic circuit formed in the integrated circuit element having the large area is deteriorated as compared with a logic circuit formed in the integrated circuit chip having a commonly used size or a logic circuit formed by the conventional module packaging technique.

In the embodiment, in order to improve the above problem, long-distance wiring formed in the large-sized integrated circuit element 1 uses, for example, copper having a lower electrical resistance than that of aluminum. In addition, in order to further reduce the wiring resistance, the wiring is formed thicker than conventional aluminum wiring. The copper wiring can be formed in a plating process and accordingly it is possible to form the wiring to a thickness of several μm or more. In this manner, by using thick wiring made of copper, the wiring resistance can be remarkably reduced as compared with the conventionally used aluminum wiring. In the specification, this copper wiring is named thick film copper wiring.

At least one wiring layer by the thick film copper wiring is provided in the large-sized integrated circuit element 1 and the thick film copper wiring of the wiring layers is used to form long-distance wiring, so that the wiring resistance of the long-distance wiring formed in the large-sized integrated circuit element 1 can be reduced to shorten the propagation delay time. Further, the thick film copper wiring is used for not only the signal wiring but also power supplying wiring, so that an effective supply of electric power can be attained. Short-distance wiring or wiring of a signal which is not required to be propagated at high speed can be aluminum wiring having a thickness of 1 μm or less in the same manner as the prior art, so that wiring with high density can be made.

Figure 3:
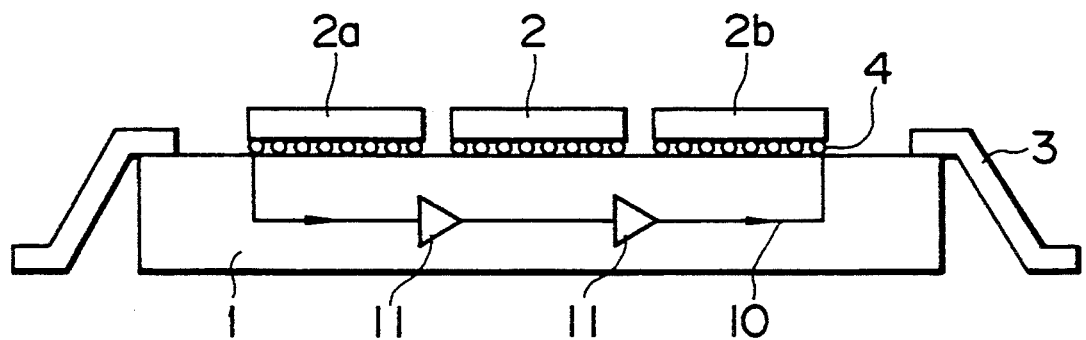
FIG. 3 is a sectional view schematically illustrating an example of an internal circuit of a large-sized integrated circuit element.

FIG. 3 schematically illustrates an example of circuit elements formed in the large-sized integrated circuit element 1 of the embodiment.

In FIG. 3, formed in the large-sized integrated circuit element 1 is a network logic circuit for interconnecting between the plurality of integrated circuit chips 2 mounted on the element 1. Numeral 10 denotes signal wiring formed in the large-sized integrated circuit element 1 to connect between signal terminals of the integrated circuit chip 2. Buffers 11 are connected in proper portions of the signal wiring 10, and an output signal produced by an integrated circuit chip 2a is propagated through the signal wiring 10 and relayed by means of the buffers 11 to be supplied to an integrated circuit chip 2b.

Figure 4:
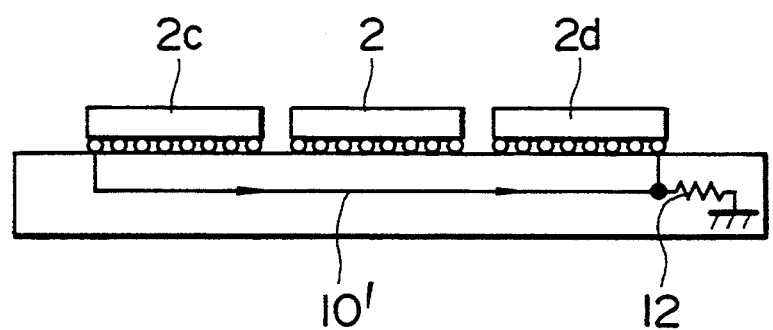
FIG. 4 is a sectional view schematically illustrating signal transmission between LSI chips in a conventional module packaging technique.

According to the conventional module packaging technique, for example, as shown in FIG. 4, a signal produced by an integrated circuit chip 2c is propagated through a signal wiring 10' on a ceramic wiring substrate to an integrated circuit chip 2d. The signal propagation according to the conventional module packaging technique employs matched impedance transmission in order to eliminate reflection of a signal at an end of the wiring. Usually, a terminating resistor 12 is required to attain the matched impedance transmission. The terminating resistor 12 is an important element for preventing reflection of a signal, while when a potential of the signal wiring 10 on the substrate is in a steady state except zero potential, that is, ground potential, useless electric power is dissipated by the terminating resistor 12 regardless of the signal transmission.

On the other hand, if the signal wiring is sufficiently short, it is able to ignore influence by the reflected wave by shortening the signal wiring until the time for a reflected wave of a signal to return to a transmitting end is shorter than the time required for rising or falling of the signal. According to this embodiment, by relaying the signal by means of the buffers 11, the signal wiring 10 between the integrated circuit chips 2a and 2b can be divided to be shortened until influence by the reflection is removed and the necessity for using the matched impedance transmission for the signal wiring between the integrated circuit chips can be eliminated. Accordingly, useless electric power dissipated by the terminating resistor can be eliminated and the power consumption of the semiconductor integrated circuit device can be reduced.

Figure 5:
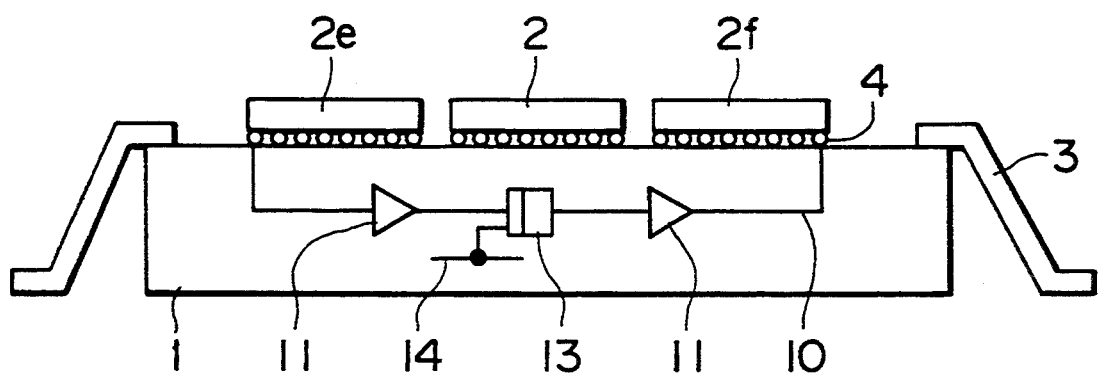
FIG. 5 is a sectional view schematically illustrating another example of an internal circuit of the large-sized integrated circuit element.

FIG. 5 schematically illustrates another example of circuit elements formed in the large-sized integrated circuit element 1.

In this embodiment, for example, an output signal of an integrated circuit chip 2 is propagated through the signal wiring 10 formed in the large-sized integrated circuit element 1 to an integrated circuit chip 2f. The buffers 11 and a latch 13 are connected on the way of the signal wiring 10. The latch 13 is supplied with a clock signal from a clock signal supplying line 14 formed in the large-sized integrated circuit element 1.

The output signal produced by the integrated circuit chip 2e is supplied to the latch 13 through the signal line 10 and is latched in synchronism with the clock signal supplied from the clock signal supplying line 14. An output signal of the latch 13 is supplied to the integrated circuit chip 2f through the signal wiring 10. Not shown in the figure, an output latch formed in the integrated circuit chip 2e for latching the output signal, a latch formed in the integrated circuit chip 2f for receiving an input signal, and the latch 13 are operated in synchronism with the clock signal distributed from the clock signal supplying line 14. In this manner, by providing the latches on the signal transmission path, a so-called pipeline transfer can be attained.

In the pipeline transfer, a signal is transmitted over one section on the signal transmission path divided by a plurality of latches in one clock. Accordingly, as shown in FIG. 5, when one latch is provided on the way of the signal wiring from the integrated circuit chips 2e to 2f, the signal transmission from the integrated circuit chips 2e to 2f is made by two clocks. According to the conventional module packaging technique as shown in FIG. 4, since the signal transmission from the integrated circuit chips 2c to 2d is made by one clock, the clock period cannot be made shorter than a signal propagation delay time between the integrated circuit chips. On the contrary, the use of the pipeline transfer can use a clock signal having a shorter period than the signal propagation delay time between the integrated circuit chips.

In this embodiment, the transmission path is divided into two sections by the single latch 13, while a plurality of latches 13 can be provided in the path of the signal wiring 10 to make shorter a distance for one section. The distance of one section of the signal wiring 10 is made short, so that a clock signal having a shorter period can be used for signal transmission.

While a detailed description is omitted, when generation of heat of the integrated circuit chip causes trouble, a cooling fin or a water cooling structure is attached on a rear surface (opposite surface to a surface on which solder bumps are formed) of the integrated circuit chip 2 to cool the semiconductor integrated circuit chip 2 to cool the semiconductor integrated circuit device.

As an example of a system to which the semiconductor integrated circuit device as described above is applied, a multi-processor type general-purpose computer system including a plurality of instruction processors which use a main memory in common is considered. FIG. 6 is a block diagram showing an example of a configuration of a multi-processor type general-purpose computer system.

In FIG. 6, numeral 600 denotes an instruction processor, 601 a system controller unit, 602 a cache memory unit, 603 a main storage unit, and 604 an input/output unit.

First of all, each of the units is described. The main storage unit 603 stores instructions executed by the instruction processors 600 and data to be processed by the instructions. The instruction processor 600 reads the instructions stored in the main storage unit 603 sequentially and interprets the instructions to process data or the like read from the main storage unit 603. The data processed by the instruction processor 600 are written into the main storage unit 603. The cache memory unit 602 is a memory accessible at higher speed than the main storage unit 604 and holds a copy of part of the information stored in the main storage unit 603. The system controller unit 601 accesses the cache memory unit 602 in response to an instruction or a request of reading/writing of data from the instruction processor 600 and reads the instruction or data from the main storage unit 603 when a copy of the instruction or data is not held in the cache memory unit 602, so that the contents of the cache memory unit 602 and the main storage unit 603 are exchanged and controlled to be identical. Such a control in the system controller unit 601 can make short the access to the main storage unit 603, apparently. Further, the system controller unit 601 also controls a connection state and an access sequence among the instruction processors 600, the cache memory unit 602 and the input/output unit 604.

The input/output unit 604 controls inputting and outputting operation of information from and to, for example, a large capacity storage unit such as a disk unit, an expanded memory unit or a console terminal unit.

As an example of the multi-processor type general-purpose computer system to which the semiconductor integrated circuit device described above is applied, the system controller unit 601 and the cache memory unit 602 are formed within the large-sized integrated circuit element 1 described in conjunction with FIG. 1. Each one of the instruction processors 600 is formed by means of a single integrated circuit chip 2. The four integrated circuit chips 2 each forming the instruction processor 600 are mounted on the large-sized integrated circuit element 1 having the system controller unit 601 and the cache memory unit 602 formed therein and are electrically connected to each other to thereby constitute a semiconductor integrated circuit device. Since one of the instruction processors 600 and the system controller unit 601 are substantially identical in the circuit scale, the number of circuit elements formed within the large-sized integrated circuit element 1 is approximately equal to the number of circuit elements formed within the integrated circuit chip 2 in the above configuration, and the yield of the large-sized integrated circuit element 1 can be made substantially equal to the yield of the integrated circuit chip 2.

The main storage unit 603 and the input/output unit 604 can be provided outside of the semiconductor integrated circuit device as constructed above and be connected to the device, to thereby realize the multi-processor type general-purpose computer system having the configuration shown in FIG. 6. Further, a plurality of such general-purpose computer systems are provided to connect between the system controller units 601 of each of the computer systems, so that a multiprocessor type general-purpose computer system having a larger number of instruction processors can be realized.

Generally, many signal lines are concentrated to the system controller unit 601 from the instruction processors 600, the main storage unit 603, the input/output unit 604 and other system controller units. Accordingly, when the system controller unit is integrated to be constructed by a single integrated circuit device, providing a large number of signal pins for the integrated circuit device is a problem.

It is considered that the system controller unit is integrated and configured by the large-sized integrated circuit element by means of the conventional module packaging technique in order to take out a large number of signal pins. In this case, when the face down method using the flip chip connection by solder bumps is applied to the connection between the large-sized integrated circuit element and a wiring substrate on which the element is mounted, large distortion is exerted on solder bump electrodes due to a difference of a coefficient of thermal expansion between the integrated circuit element and the wiring substrate and there is an increased possibility that the solder bumps will be broken. Accordingly, the face down method capable of taking out the large number of signal pins cannot be applied. Thus, the integrated circuit element constituting the system controller unit and the wiring substrate is connected from the large-sized LSI chip by means of wire bonding or TAB. In the wire bonding or TAB, the signal pins can be taken out from only four sides of the integrated circuit board and the number of derivable signal pins is limited, so that the number or the scale of other devices capable of being connected to the system controller unit 601 is limited by the upper limit of the number of derivable signal pins.

In this embodiment, the instruction processors 600 are constructed by the integrated circuit chips 2 and are mounted on the large-sized integrated circuit element 1 in which the system controller unit 601 is integrated. With this structure, the face down method using the solder bump electrodes can be applied to connection of the integrated circuit chips 2 and the large-sized integrated element 1. Accordingly, the signal pins of the large-sized integrated circuit element 1 connected to the wiring substrate by the wire bonding or TAB can be limited to a part necessary for connection to the main storage unit 603 and the input/output unit 604 and the limitation to the scale of the whole system due to the limit of the number of signal pins as described above is relieved.

In the embodiment, of the general-purpose computer system to which the semiconductor integrated circuit device according to the present invention described above is applied, the cache memory unit 602 is provided within the large-sized integrated circuit element, while a part or all of the cache memory unit 602 may be constructed by the integrated circuit chip mounted on the large-sized integrated circuit element. By combining the main storage unit 603, the input/output unit 604 and the like with the semiconductor circuit device constructed above, the same system as the above-mentioned multiprocessor type general-purpose computer system is configured.

As described above, by providing only the system controller unit 601 or only the system controller unit 601 and a part of the cache memory unit 602 within the large-sized integrated circuit element 1, the number of circuit elements integrated within the large-sized integrated circuit element 1 can be reduced and the yield of the large-sized integrated circuit element 1 can be improved as compared with the embodiment of the general-purpose computer system described above.

Further, when the circuit scale of the instruction processor 600 is large and the instruction processor 600 cannot be integrated as the single integrated circuit chip 2 on the large-sized integrated circuit element 1, the instruction processor 600 may be constructed by two or more integrated circuit chips 2 and even in this case the same general-purpose computer system as described above can be constructed.

As described above, by applying the semiconductor integrated circuit device according to the present invention to integration of a large scale device such as the multiprocessor type computer system having a main storage unit used in common, the large scale device can be made compact.

Furthermore, a parallel computer system having a multiplicity of computer systems connected in parallel can be configured by the semiconductor integrated circuit device of the present invention with a reduced logic scale of the general-purpose computer system as described in the above embodiment and with configuring one computer system by one integrated circuit element. The parallel computer system is now described in detail.

Figure 7A:
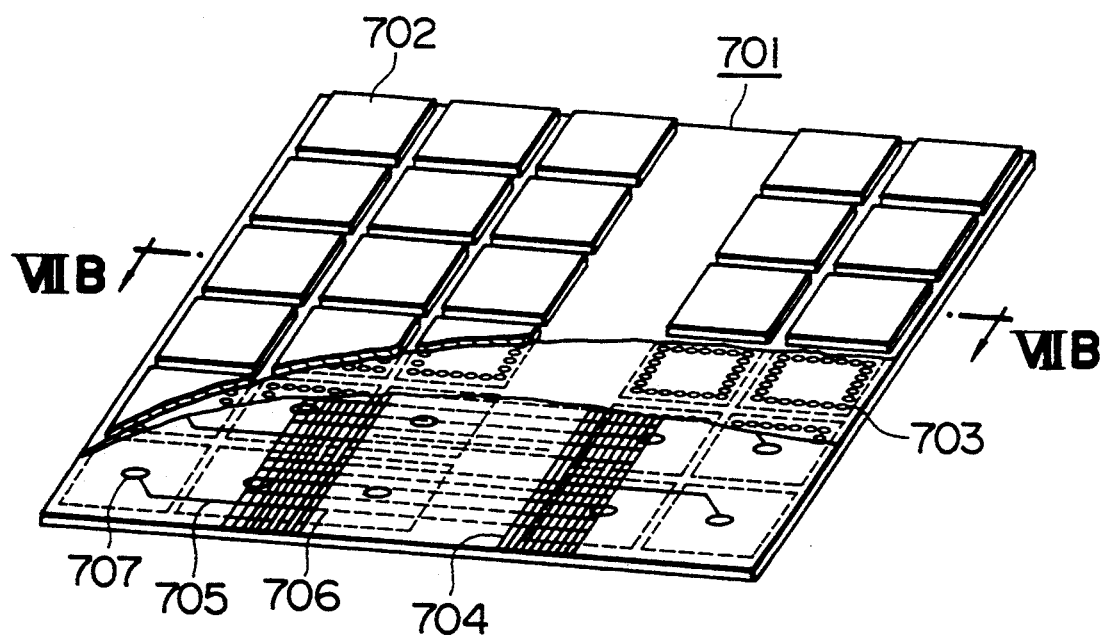
FIGS. 7A and 7B are a perspective view and a sectional view schematically illustrating an embodiment of a parallel computer system using the semiconductor integrated circuit device of the present invention, respectively.
Figure 7B:
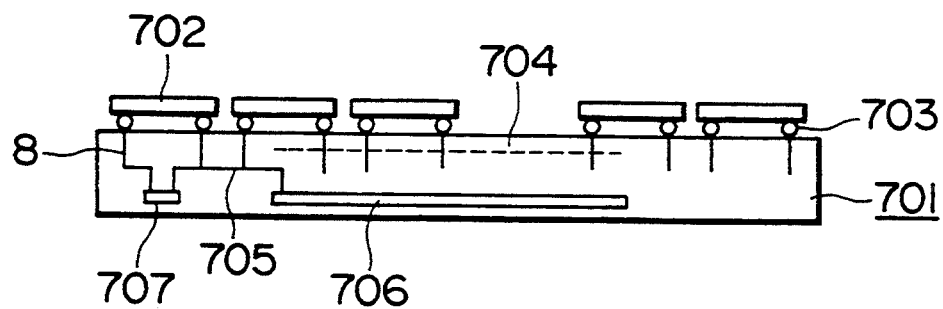

FIG. 7A is a partially broken-away perspective view schematically illustrating an embodiment of the parallel computer system according to the present invention and FIG. 7B is a sectional view taken along line VII-VII' of FIG. 7A.

The embodiment uses a wafer scale integrated circuit device (WSI) as the large-sized integrated circuit element.

Formed in a network WSI 701 constituting the wafer scale integrated circuit device are a crossbar network circuit constituting an interconnection network between processors and its auxiliary functional circuit, and a plurality of processor element chips 702 are mounted on the network WSI 701 and connected thereto. The processor element chips 702 can communicate with each other through the crossbar network circuit constituting the interconnection network of the network WSI 701.

As the interconnection network between the processors, there are considered a static interconnection network (a perfect interconnection network, a star interconnection network, a chain interconnection network, an annular interconnection network, a tree interconnection network, a lattice interconnection network and the like which are single stage interconnection networks) having a fixed connection relation, a dynamic interconnection network (a crossbar interconnection network, a close interconnection network, an omega interconnection network and the like) having a connection relation capable of dynamically varying in accordance with a connection request and the like as well as the crossbar network. The dynamic interconnection network is named a switching network and each of the switches is properly controlled to connect between processors dynamically and variably. In this embodiment, the crossbar interconnection network which is one of the dynamic interconnection networks is used, although various interconnection networks can be applied.

Solder bump electrodes 703 for connecting the processor element chips 702 are formed on a surface of the network WSI 701 in alignment with terminals of the chips. A crossbar network circuit formed by different layers of lengthwise paths 704 and lateral paths 705 for wiring of the crossbar network is formed within the network WSI 701. Two layers of a wiring layer and a diffused device layer are disposed under the crossbar network circuit and a necessary auxiliary functional circuit such as a selector circuit 706 constituting the crossbar switch and an input/output buffer memory circuit 707 is formed,therein. Further vertical wirings 8 utilizing a through-hole layer are formed to connect between the layers.

The lengthwise paths 704, the lateral paths 705 and the selector circuit 706 of the network WSI 701 are connected by a wiring group to the switches, and constitute a so-called regular logic circuit having high regularity. In the specification, "regular logic circuit" is used in the sense that it has the repeatability of a functional unit and, more generally speaking, when a plurality of logic circuit units including at least one or more circuit elements and at least one or more wirings for connecting the circuit elements and providing a combined logical function are collected, the regular logic circuit designates a set of logic circuit units (for example, memory cells arrayed in a matrix) which is characterized in that a relative position relation between circuit elements and a relative position relation between wirings for connecting the circuit elements within the logic circuit unit are identical between the logic circuit units. It is considered that most of the network WSI 701 is constituted by the regular logic circuits.

The network WSI 701 according to the present embodiment is constructed, for example, as a WSI formed of a CMOS having a dimension of 100 mm square. The network WSI 701 includes a diffused device layer formed at a lowermost layer for forming active elements, first metal wiring layers formed in directions intersecting each other at two layers overlying the diffused device layer primarily for forming circuits, second metal wiring layers for long distance wiring formed at two layers overlying the first metal wiring layers to intersect each other primarily for connecting between the circuits, and a through-hole layer for connecting adjacent layers. Further solder bump electrodes 703 for connecting the processor element chips, which are integrated circuit devices formed on the surface of the network WSI 701 in alignment with terminals of the chips. The network WSI 701 in the embodiment includes circuits and wiring for the crossbar network circuit and its auxiliary functional circuit constituting the interconnection network between the processors formed even in portions covered by the mounted processor element chips 702. The network WSI 701 is to provide the crossbar network as the interconnection network between the processors having a transfer width of 81 bits and each of the numbers of input/output to be exchanged of 30.

The processor element chip 702 is formed as a CMOS integrated circuit chip having a dimension of, for example, 15 mm square and including functions of memory, operation processing, instruction control, memory control, network control and the like. More particularly, the processor element chip 702 comprises a ROM for storing instructions, a RAM primarily for storing data, a storage control unit including a control circuit, an operation circuit unit including a circuit such as an ALU for performing an operation in accordance with instructions, a register file unit for storing data temporarily, an input/output unit for performing data input/output operations to the outside of the processor, a controller unit for controlling these units in accordance with instructions, and a bus for connecting the units. Portions including the ROM and the RAM in the configuration of the processor as described above include a large number of memory cells arrayed into a matrix and the portions are constituted by the so-called regular logic circuit described above. However, in the processor element chip 702, an area occupied by irregular logic circuits having regularity which is not so high and constituting the storage control unit, the operation circuit unit, the register file unit and the input/output unit is larger than an area occupied by the regular logic circuit. In this embodiment, 30 processor element chips 702 are mounted on the network WSI 701.

Figure 20A:
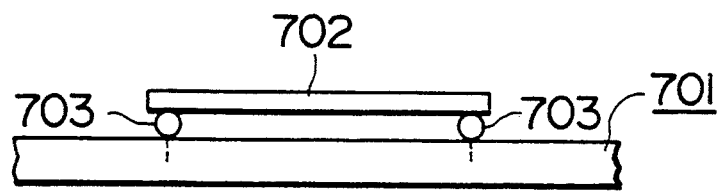
FIGS. 20A, 20B and 20C schematically illustrate various connecting method of a chip.
Figure 20B:
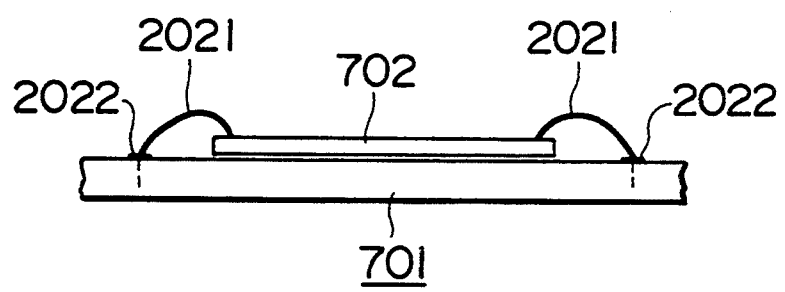
Figure 20C:
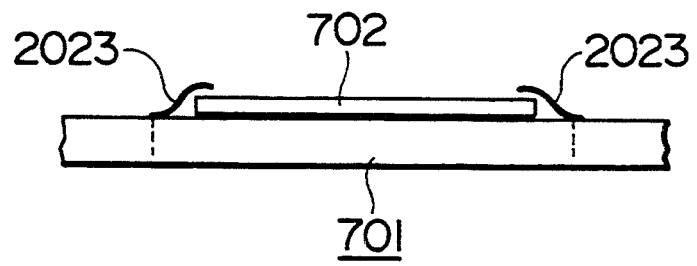

These processor element chips 702 are mounted in the bare chip state on the network WSI 701 as shown in FIG. 20A in section and all of the signal terminals and power supply terminals of the processor element chips 702 are connected to solder bump electrode terminals 703 on the surface of the WSI. The processor element chips 702 can be connected by wire bonding using bonding wires 2021 as shown in FIG. 20B (in which 2022 represents a bonding pad) or by TAB using tape automated bonding (TAB) lead 2023 as shown in FIG. 20C. The processor element chip 702 may be sealed into a package if necessary and the packaged processor element chip 702 can be mounted on the network WSI 701.

Figure 8:
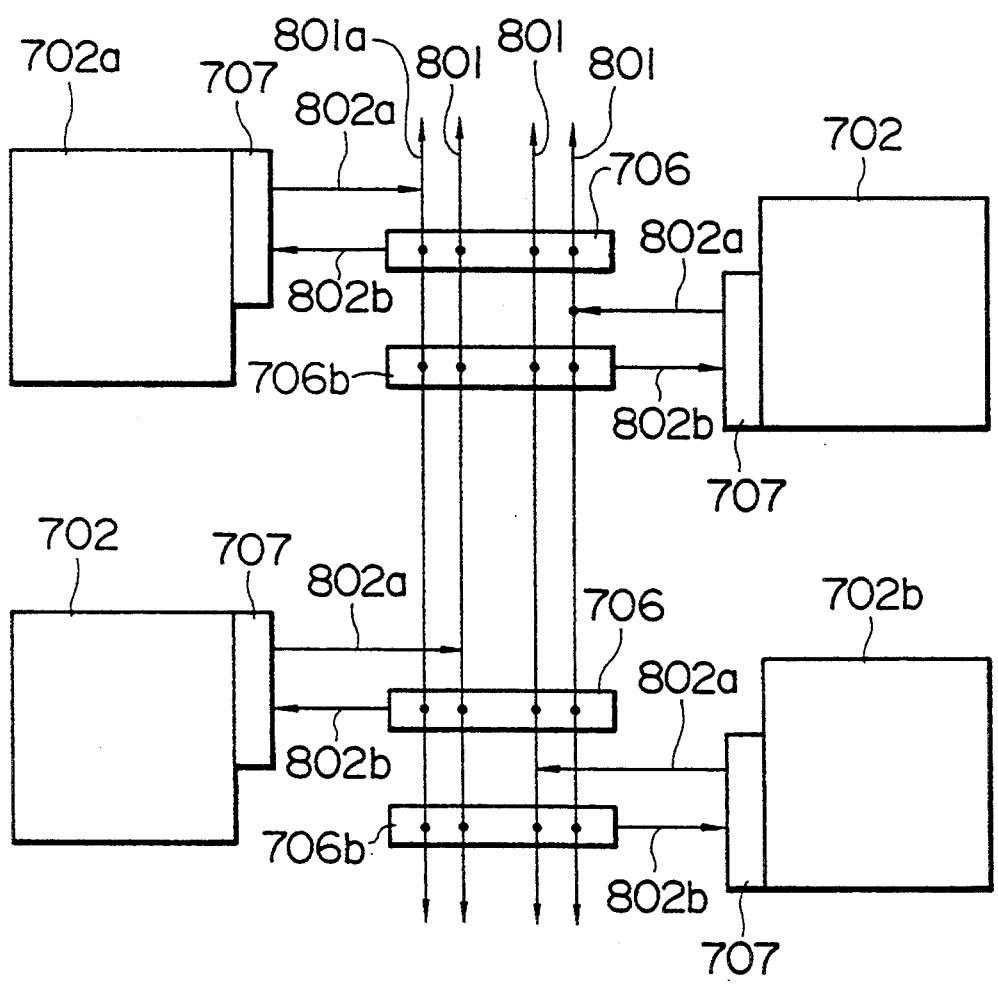
FIG. 8 schematically illustrates a crossbar interconnection network.

FIG. 8 schematically illustrates a crossbar network as the interconnection network between processors on the network WSI 701, and more particularly shows an example of a four-input and four-output crossbar network to which four processor element chips 702, 702a, 702b, for example, of a plurality of processor element chips are connected.

The processor element chips 702, 702a and 702b are connected through input/output buffer storage units 707 and lateral buses 802a to associated lengthwise buses 801 and 801a, respectively. Selector circuits 706 and 706b are arranged to intersect all of the lengthwise buses 801 and 801a. The number of input terminals of the selector circuit is 81×4 (transfer width×the number of processor element chips)=324 in the case shown in FIG. 8, each of which is connected to all of the lengthwise buses 801 and 801a. Outputs of the selector circuits 706 and 706b are connected through the lateral buses 802b to the input/output buffer storage circuits 707. An input signal and an output signal of the processor element chips 702, 702a and 702b have a width of 81 bits including a data signal, a control signal and a parity signal, respectively. The lateral buses 802a and 802b function as a part of the lateral paths 705 in FIG. 7 and the lengthwise buses 801 and 801a function as a part of the lengthwise paths 704 in FIG. 7.

Referring to FIG. 8, communication from the processor element chip 702a of a communication source to the processor element chip 702b of a communication destination is now described. The output signal of 81 bits from the processor element chip 702a of the communication source is produced through the input/output buffer storage unit 707 and the lateral bus 802a to the lengthwise bus 801a. The selection circuit 706b corresponding to the processor element chip 702b of the communication destination is operated in response to the control signal included in the output signal. The selector circuit 706b selects a signal from the processor element chip of the communication source to provide it to the lateral bus 802b. The signal of the selector circuit 706b is supplied through the input/output buffer storage unit 707 to the processor element chip 702b of the communication destination and the communication operation is completed. Similarly, a plurality of any pairs of processor element chips 702 except the processor element chips 702a and 702b can communicate with each other simultaneously through a route of the processor element chip 702, the input/output buffer storage unit 707, the lateral bus 802a, the lengthwise bus 801, the selector circuit 706, the lateral bus 802b, the input/output buffer memory circuit 707 and the processor element chip 702.

Figure 9:
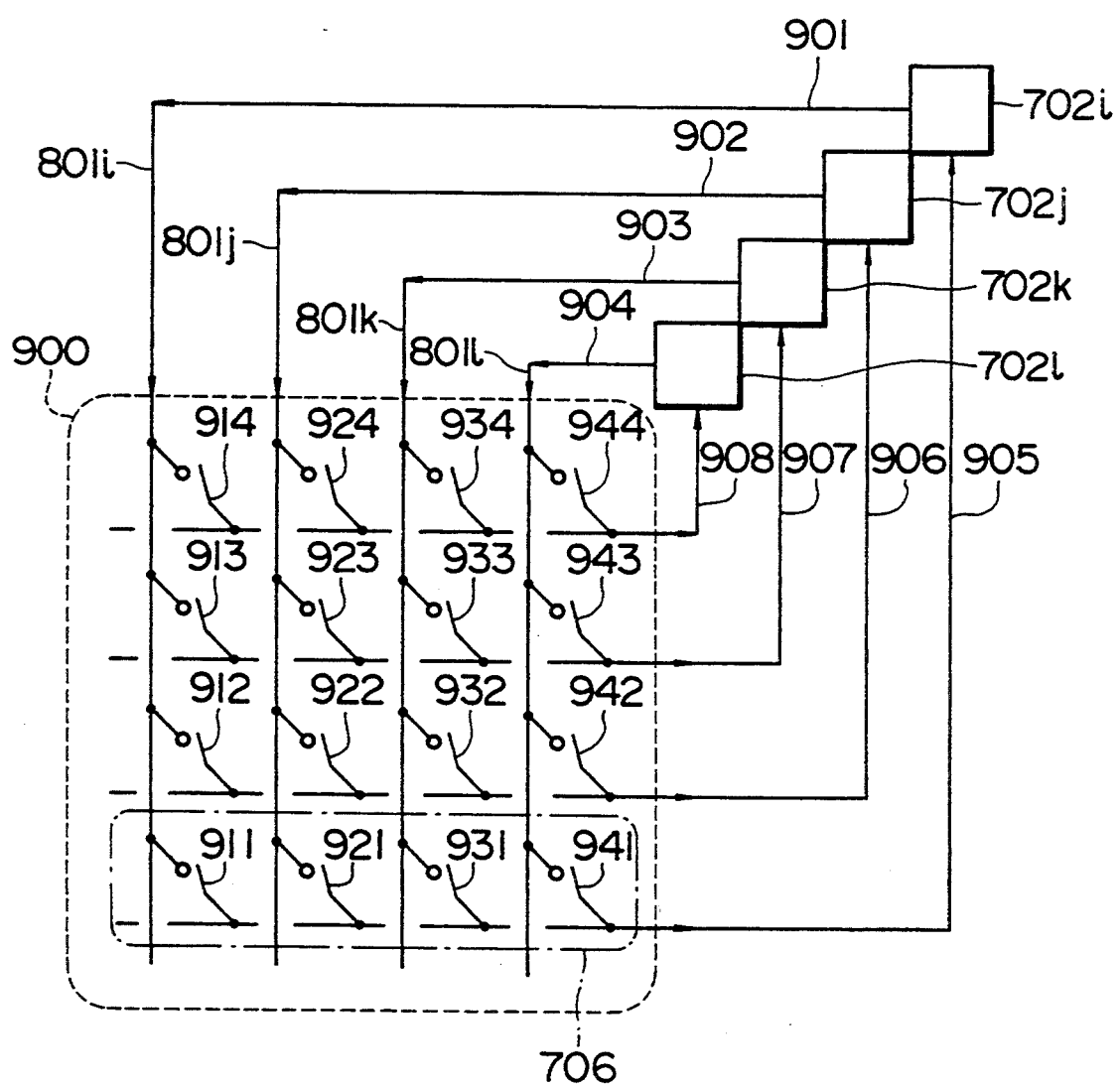
FIG. 9 schematically illustrates a configuration for interconnecting processor element chips by means of the crossbar interconnection network.

A concept of the configuration of interconnecting between the processor element chips by means of the crossbar network is now described with reference to FIG. 9. FIG. 9 also schematically illustrates an example of a four-input-and-four-output crossbar network for connecting four processor element chips 702i, 702j, 702k and 702l. (In this connection, different reference numerals are used in FIGS. 7, 8 and 9 but there is no significant difference in meaning. For example, there is no doubt that the processor element chips 702, 702a and 702b and the processor element chips 702i, 702j, 702k and 702l constitute integrated circuit devices, but, even though in FIG. 8 numerals 702a and 702b are used in order to make clear that the particular processor element chips 702a and 702b communicate with each other and other processor element chips are merely designated by 702 in FIG. 9 numerals 702i, 702j, 702k and 702l are merely used in the sense of the common processor element chips in order to deal with the four processor element chips on equal terms. The meaning of other numerals is the same.)

The processor element chips 702i, 702j, 702k and 702l produce multi-but output signals in parallel and are connected to output data buses 901, 902, 903, and 904. The output data buses 901, 902, 903 and 904 are connected to the lengthwise buses 801i, 801j, 801k and 801l connected to inputs of the crossbar network 900, respectively. The crossbar network 900 includes 16 bit-parallel switches 911, 912, 913, 914, 921, 922, 923, 924, 931, 932, 933, 934, 941, 942, 943 and 944. The bit-parallel switch is a switch capable of connecting or disconnecting all of a plurality of parallel signal lines in synchronism with each other. Outputs of the crossbar network are connected through input data buses 905, 906, 907 and 908 of the processor element chips to the processor element chips 702i, 702j, 702k, and 702l, respectively.

The fact that the crossbar network can be constructed as an assemblage of the selector circuits 706 is now described with reference to FIG. 9. In the bit-parallel switches constituting the crossbar network, only one of four juxtaposed bit-parallel switches, for example, 911, 921, 931, and 941, can be in the connected state or closed state simultaneously because a collision state of data occurs and a meaningless signal is produced when two or more switches are in the connected state simultaneously. The four juxtaposed switches are treated as one group and the function of the group is now considered. Since only one switch can be made in the connected state simultaneously even at the maximum, an output of the group is either the output signal of the processor element chip associated with the switch in the connected state or in the state in which all of the switches in the group are disconnected. The function of the group is understood to be a selector function in that any one of the output signals of the processor element chips connected to the crossbar network is selected. In other words, the group constitutes the selector circuit. By providing four selector circuits 706 and connecting inputs thereof to outputs of the processor element chips, the crossbar network 900 can be configured as an assemblage of the selector circuits 706.

Figure 10:
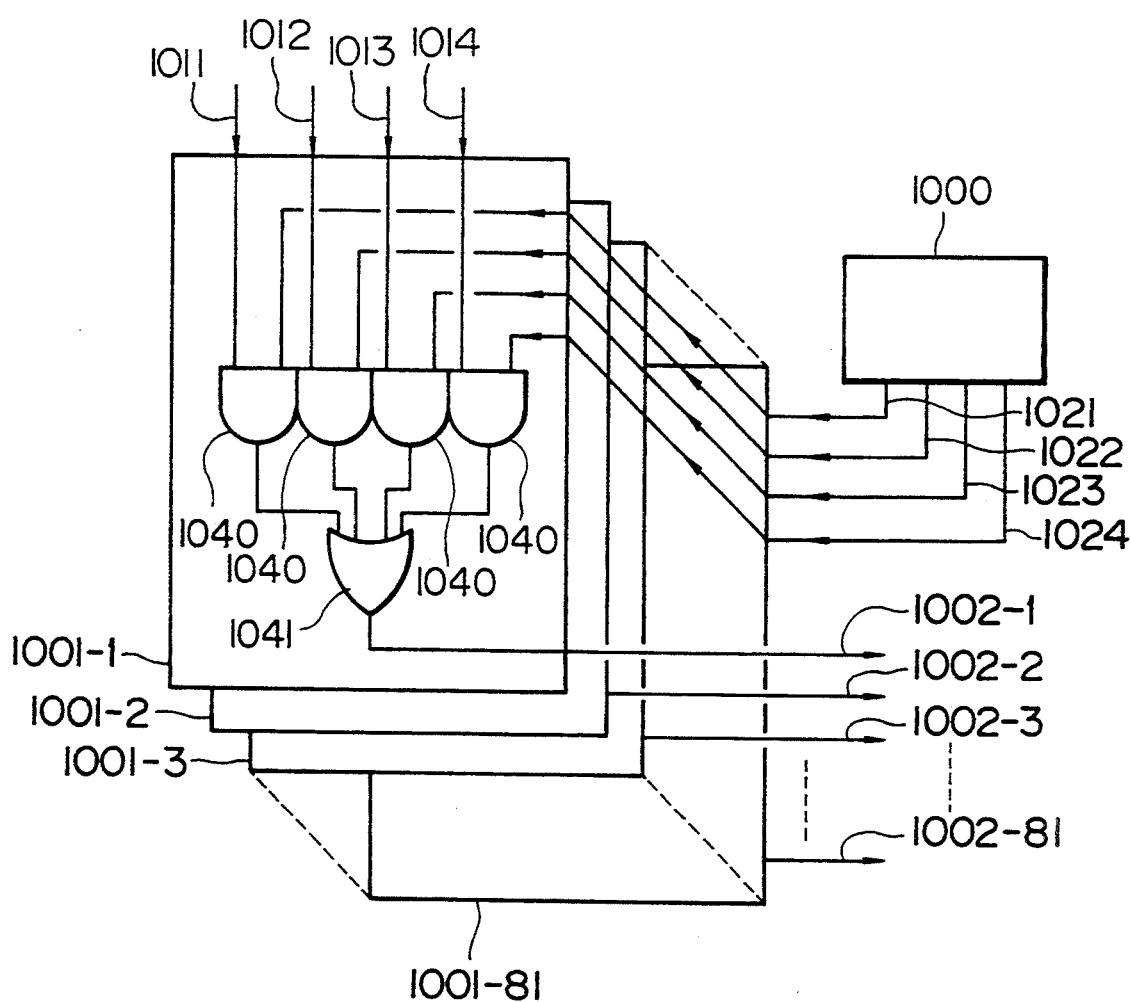
FIG. 10 is a circuit diagram of a selector circuit.

FIG. 10 is a circuit diagram showing an example of an actual configuration of a selector circuit 706 from the crossbar network 900.

FIG. 10 shows a circuit diagram of a selector circuit having four inputs and one output by way of example. The inputs and output are constructed by a plurality of parallel wirings to form a multi-bit configured selector circuit.

A first-bit selector circuit 1001-1 selects one of first-bit signal lines 1011, 1012, 1013 and 1014 of the input signals of the processor element chips in accordance with a selector control unit 1000 and provides it to a first-bit signal line 1002-1 on the side of the output. Similarly, second- and third-bit selector circuits 1001-2 and 1001-3 are provided and the same selector circuits are provided repeatedly until a final-bit selector circuit 1001-81 is provided. The selector control unit 1000 provides a signal to one of select signal lines 1021, 1022, 1023 and 1024 to designate a signal to be selected to the selector circuits for each bit. The input signals and the select signal corresponding thereto are supplied to two-input AND circuits 1040, and output signals of the four AND circuits 1040 are supplied to a four-input OR circuit 1041, so that one selected signal is produced. Thus, the first bit of the selected input signal is provided to the first-bit signal line 1002-1 of the select output, the second-bit is provided to the second-bit signal line 1002-2, the third-bit is provided to the third-bit signal line 1002-3, and so on until the final-bit is provided to the final-bit signal line. As described above, the actual configuration of the multi-bit selector circuit 706 has been shown.

Figure 11:
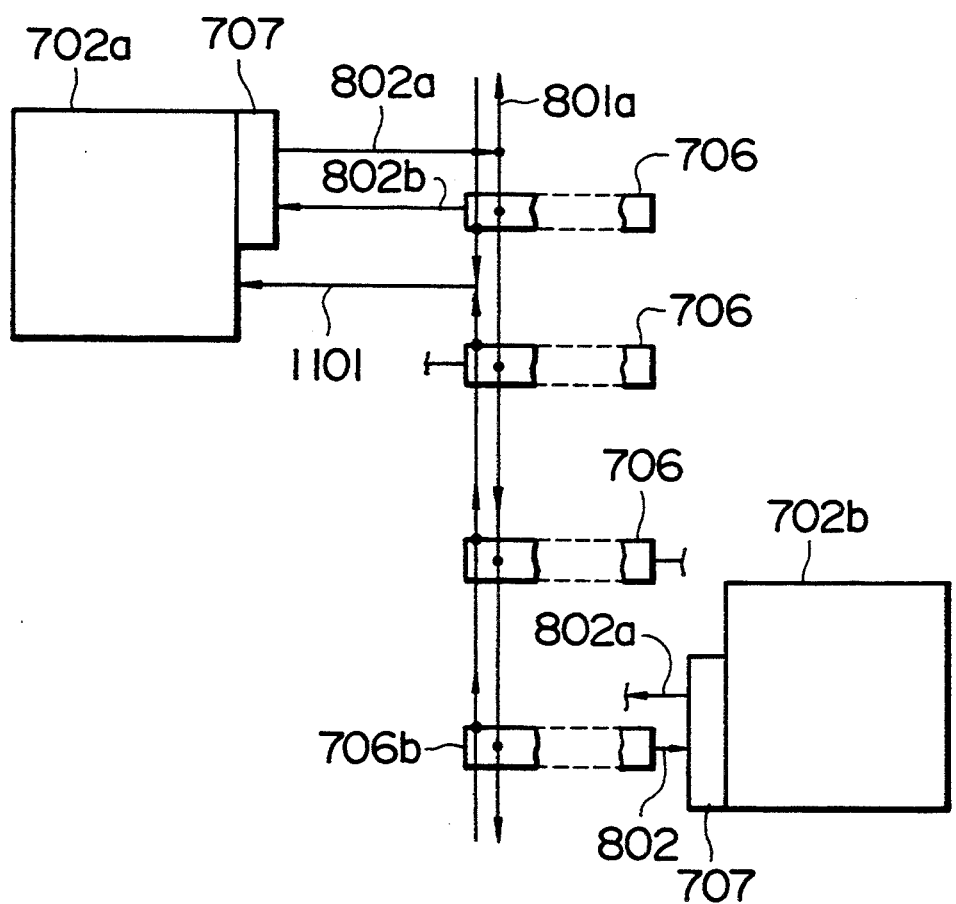
FIG. 11 schematically illustrates a pair of processor element chips.

FIG. 11 shows a pair of processor element chips 702a and 702b which communicate with each other. The description of the communication described above is supplemented with reference to FIG. 11.

The communication between the two processor element chips 702a and 702b is made essentially as described above, while collision of communication requests is also considered. In other words, there is a possibility that the processor element chip 702b of the communication destination is under communication with another processor element chip 702. In order to avoid the collision of communication requests, the processor element chip 702a of the communication source must grasp the state of the selector circuit 706b. To this end, an opposite direction wiring 1101 extending from the selector circuit 706b along the lengthwise bus 801a and the lateral bus 802a is provided. When the communication request is issued to the selector circuit 706b through the lengthwise bus 801a if the selector circuit 706b is under operation, the selector circuit 706b supplies a signal indicative of the operation state to the processor element chip 702a of the communication source by means of the opposite direction wiring 1101. The processor element chip 702a of the communication source decides whether to start the communication in accordance with the signal or not. In this manner, the opposite direction wiring can be used to avoid the collision of communication.

The opposite direction wiring 1101 from all of the selector circuits corresponding to one processor element chip 702a of the communication source is connected to the processor element chip 702a of the communication source as a single wiring as shown in FIG. 11.

Two or more opposite direction wirings 1101 may be provided to inform the processor element chip 702a of the state of the selector circuit 706b in more detail.

Figure 12A:
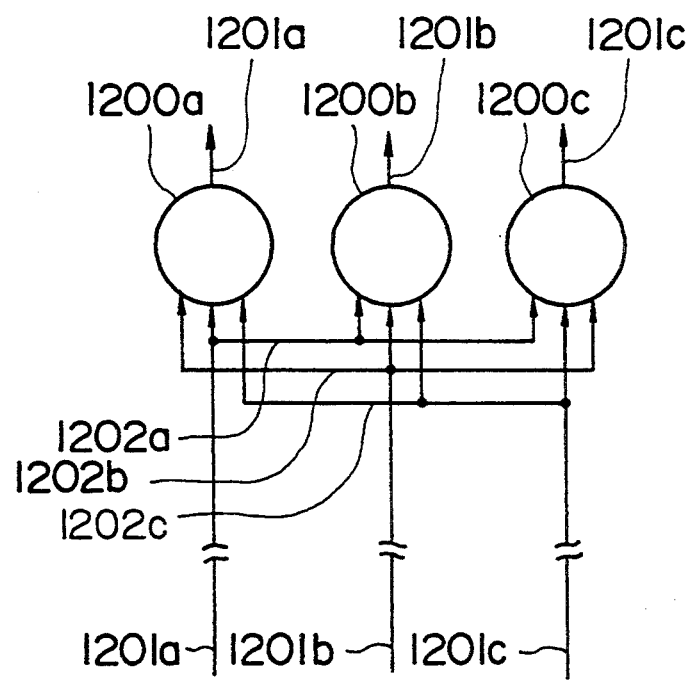
FIG. 12A schematically illustrates a circuit of triplex majority gates.
Figure 12B:
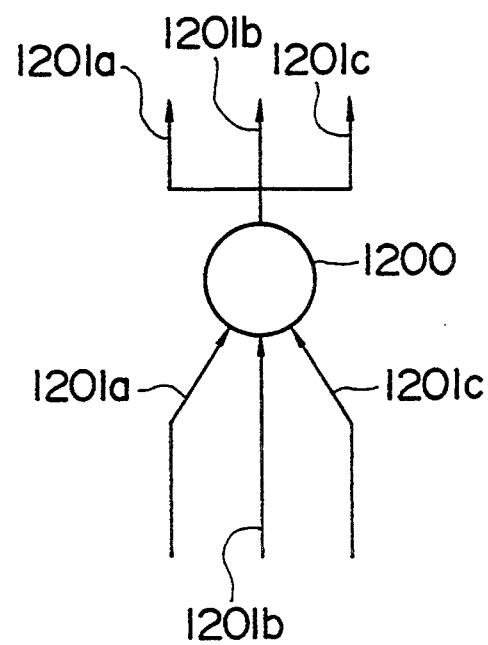
FIG. 12B schematically illustrates a majority gate.

FIG. 12A is a schematic diagram of a circuit of triplex majority gates which is applied to the lengthwise buses 801 and 801a and the lateral buses 802a and 802b of FIG. 8 for improving the yield of wiring greatly and shows a circuit corresponding to one bit and one stage. FIG. 12B is a schematic diagram of a conventional triplex circuit using one majority circuit for comparison and shows a circuit corresponding to one bit and one stage similarly.

In FIG. 12A, redundant signal lines 1201a, 1201b and 1201c transmit the same information logically. Input signals to three-input majority gates 1200a, 1200b and 1200c are applied through signal lines 1202a, 1202b and 1202c for distributing the redundant signal. Output signals from the majority gates 1200a, 1200b, and 1200c are respectively applied to the redundant signal lines 1201a, 1201b and 1201c for the next stage. In FIG. 12B, the redundant signal lines 1201a, 1201b and 1201c are connected to the three-input majority gate 1200 and an output signal from the three-input majority circuit 1200 is applied to the redundant signal lines 1201a, 1201b and 1201c for the next stage.

The first input of the majority gate 1200a is connected to each of the redundant signal line 1201a, the second input is connected to the redundant signal distributing line 1202b branched from the redundant signal line 1201b, and the third input is connected to the redundant signal distributing line 1202c branched from the redundant signal line 1201c. The first input of the majority gate 1200b is connected to the redundant signal line 1201b, the second input is connected to the redundant signal distributing line 1202a branched from the redundant signal line 1201a, and the third input is connected to the redundant signal distributing line 1202c branched from the redundant signal distributing 1201c. The first input of the majority gate 1200c is connected to the redundant signal line 1201c, the second input is connected to the redundant signal distributing line 1202a branched from the redundant signal line 1201a, and the third input is connected to the redundant signal distributing line 1202b branched from the redundant signal line 1201b.

If attention is paid to only the input and output circuit of the triplex majority gate circuit, the input and output circuit is logically identical for the parallel arrangement of three wirings. If any one of the redundant signal lines 1201a, 1201b and 1201c fails due to any cause or has any defect and erroneous signals are transmitted, the three majority gates 1200a, 1200b and 1200c function to produce correct signals. This effect is hereinafter referred to as a defect saving effect of the triplex majority gate circuit. Signal lines using a triplex majority gate having the triplex majority gate circuit connected in multiple stages are shown in FIG. 13 to be described later.

In this embodiment, the majority gate 1200a and the redundant signal line 1201a are combined to be named a-system wiring, the majority gate 1200b and the redundant, signal line 1201b are combined to be named b-system wiring, and the majority gate 1200c and the redundant signal line 1201c are combined to be named c-system wiring. Further, the three redundant signal distributing lines 1202a, 1202b and 1202c are combined to be named distributing wiring.

Figure 13A:
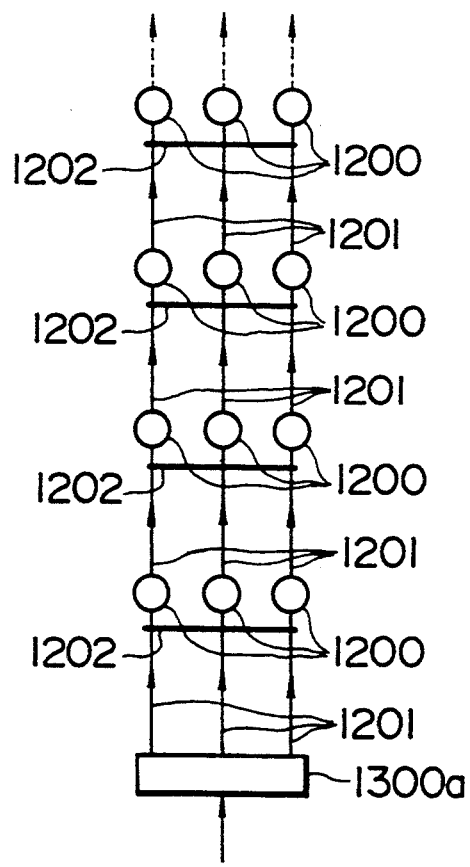
FIGS. 13A and 13B schematically illustrate signal lines using triplex majority gates using a plurality of circuits of triplex majority gates.
Figure 13B:
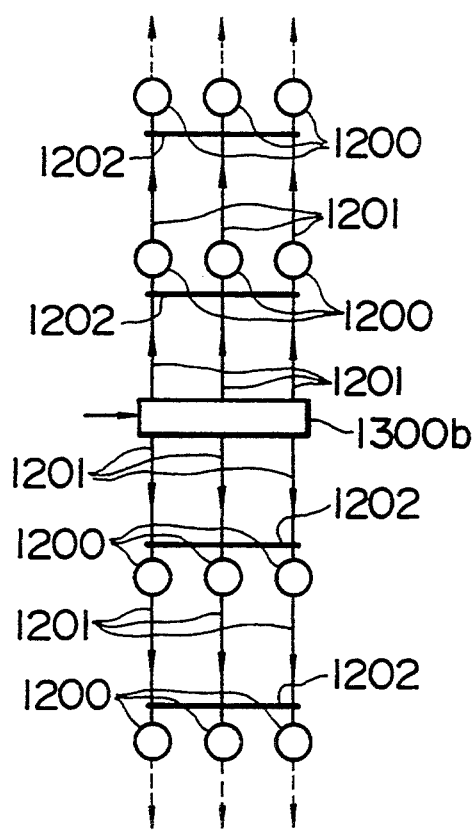

FIG. 13 schematically illustrates the signal lines using a plurality of triplex majority gate circuits, and FIGS. 13A and 13B both show circuits corresponding to one bit and multistages.

As shown in FIG. 13A, a fan-out circuit 1300a distributes a signal to three redundant signal lines 1201. The redundant signal distributing line 1202 is a distributing wiring and is connected to three 3-input majority gates 1200. Three outputs of the three majority gates 1200 are connected to the redundant signal lines 1201 for the next stage. Thus, the triplex majority gate circuits shown in FIG. 12 are connected in multiple stages to constitute the triplex majority gate signal lines. A fan-out circuit 1300b of FIG. 13B distributes a signal to a total of six redundant signal lines extending in two upper and lower directions. The triplex majority gate circuits are constituted in each of the directions in the same manner as in FIG. 13A.

Figure 17:
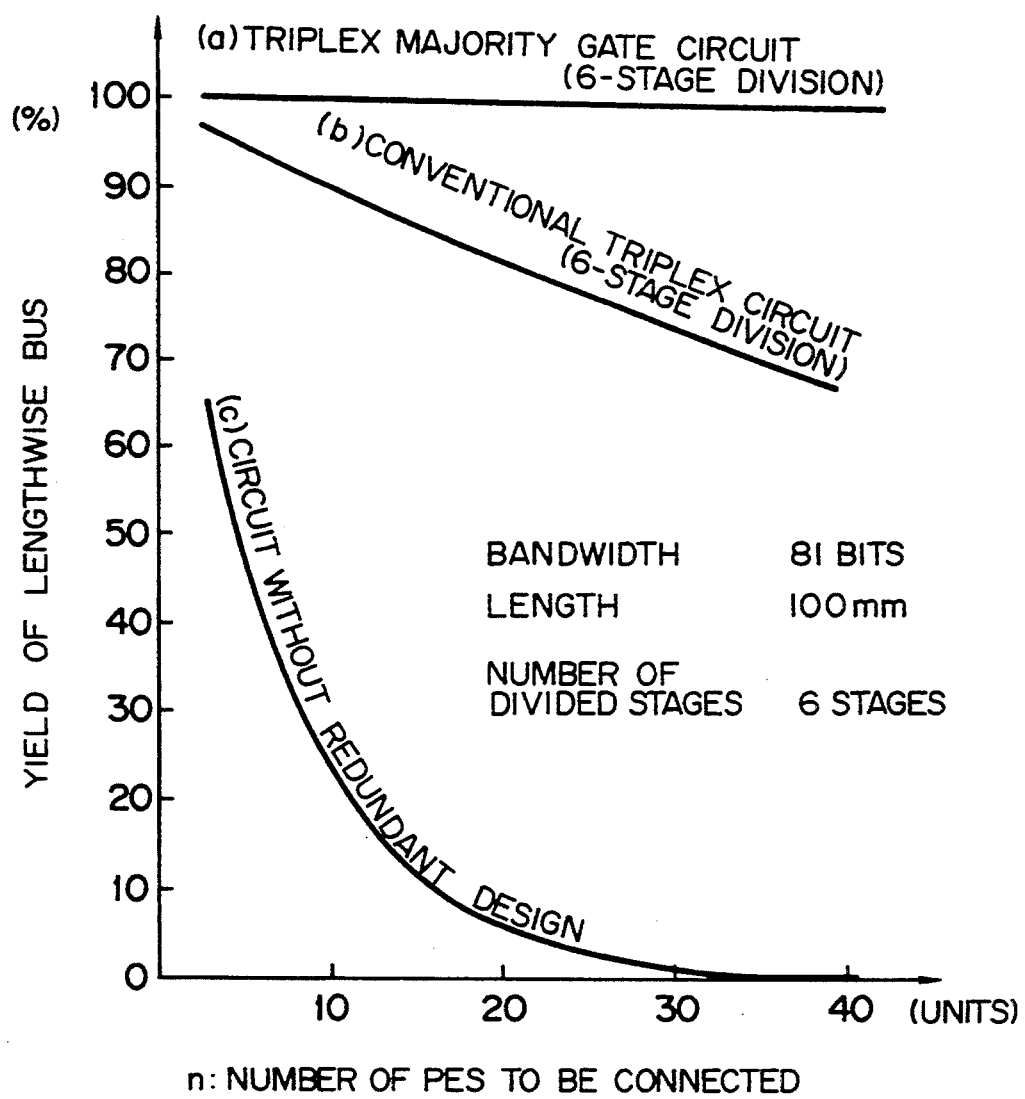
FIG. 17 is a graph showing the advantage of a redundant wiring method of the present invention as compared with the prior art.

FIG. 17 is a graph schematically illustrating comparison in the yield in each of the methods using the triplex majority gate circuit, the conventional triplex circuit and a circuit without redundant design when the lengthwise buses of the crossbar network corresponding to the number of processor element chips to be connected are formed by the above methods using the triplex majority gate circuit, the conventional triplex circuit and the circuit without redundant design. The bandwidth, the length and the number of divided stages of the lengthwise buses 801 are 81 bits, 100 mm and 6 stages (when the majority circuit is used), respectively. The abscissa of FIG. 17 represents the number of processor element chips to be connected and the ordinate represents the yield in the lengthwise buses. The yield is calculated on condition that defects are distributed uniformly and the defect density is one defect per one square centimeter. It is apparent from this graph that when the number of processor element chips to be connected is 30, the yield of the method using the triplex majority gate circuit is 98% or more and is very excellent as compared with other methods.

Figure 14:
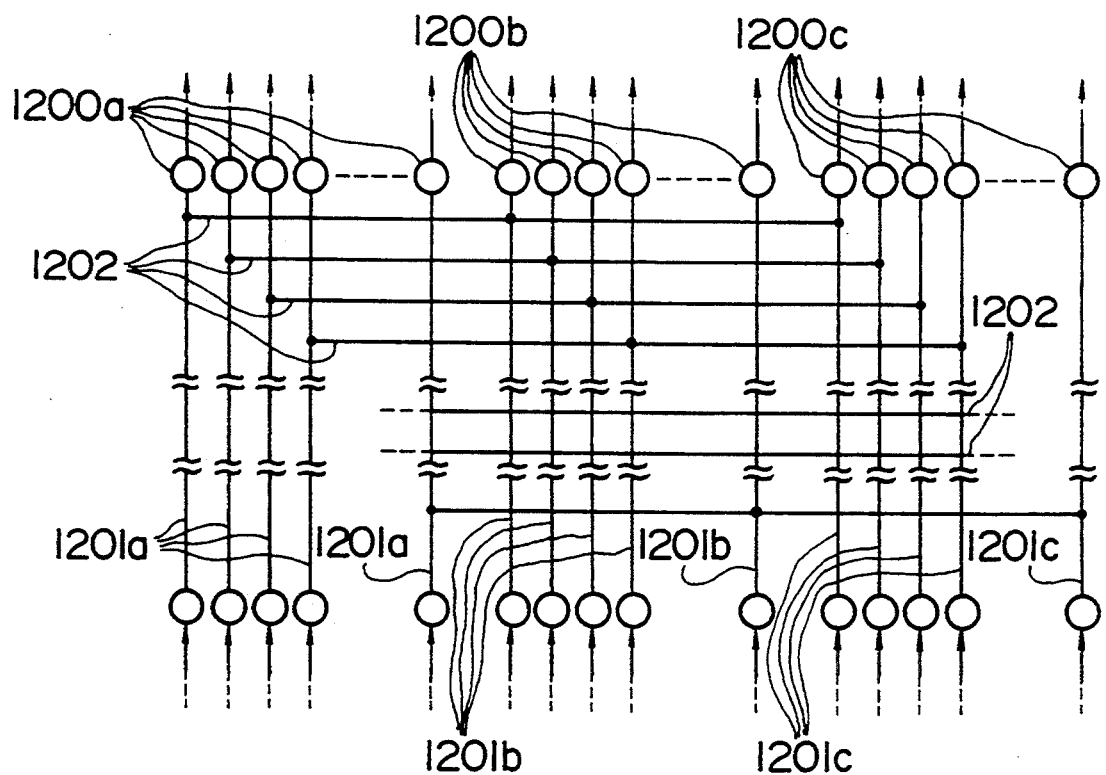
FIG. 14 schematically illustrates a method of constructing a multi-bit bus by using the circuit of triplex majority gates.

FIG. 14 schematically illustrates an arrangement method of a multi-bit wiring bus using the triplex majority gate circuit and shows a circuit corresponding to a multi-bit stage.

The triplex majority gate circuits are arranged side by side to constitute a multi-bit (81-bit in the embodiment) triplex majority gate circuit. A-system wiring of the second-bit triplex majority gate line is arranged adjacent to a-system wiring of the first-bit and the same arrangement is repeated until a-system wiring of the 81st-bit is arranged. B-system wiring of the first-bit is arranged adjacent to the a-system wiring of the 81st-bit, b-system wiring of the second-bit is arranged adjacent to b-system wiring of the first-bit, and the arrangement is repeated until the b-system wiring of the 81st-bit is arranged. C-system wiring of the first-bit is arranged adjacent to the b-system wiring of the 81st-bit, c-system wiring of the second-bit is arranged adjacent to c-system wiring of the first-bit, and the arrangement is repeated until the c-system wiring of the 81st-bit is arranged. The a-system wiring, b-system wiring and c-system wiring are connected by the distributing wiring. Numerals 1200a, 1200b and 1200c denote three-input majority gates, 1202 distributing wiring (redundant signal distributing line), and 1201a, 1201b and 1201c redundant signal lines.

As described above, the triplex majority gate signal lines can be combined to arrange the a-system wiring, b-system wiring and c-system wiring separately to correspond to the bit arrangement. In the embodiment, the majority gates 1200 are arranged continuously at intervals of 7 μm and accordingly the redundant signal lines are also arranged at the same intervals. At this time, a distance between the a-system wiring, b-system wiring and c-system wiring is about 7 μm×(81−1)=560 μm. During processing of the network WSI 701, particularly in the trial manufacturing stage, a relatively large defect having a magnitude exceeding 7 μm is considered. If the three redundant signal lines are arranged adjacent to each other, the defect saving effect is not exhibited for such a defect, while by arranging the three system wirings separately as described above, the original defect saving effect can be obtained even for the relatively large defect.

In the specification, the wiring layout method is named a layout method 1. In the layout method 1, bits corresponding to the output of one processor element chip 2, that is, 81 bits in the embodiment, are concentrated into one wiring block as one group and the wiring blocks corresponding to the total number of processor element chips 2 are arranged side by side in the whole crossbar.

On the contrary, the method in which the triplex majority gate signal lines are combined similarly and all output bits from all of the processor element chips 702 are concentrated into one wiring block is named a layout method 2 in the specification. According to this method, in the embodiment, arranged adjacent to the a-system wiring having 81×30 (number of processor element chips to be connected)=2430 lines is the b-system wiring having the same number of lines, and the c-system wiring having the same number of lines is arranged,adjacent to the b-system wiring, and all of them are connected by the distributing wiring. In this case, the length of the distributing wiring is as long as 7 $\mu m \times (2430-1) = 17$ mm at the minimum and this is a cause of reduction in the yield of the whole triplex majority gate circuit.

In order to avoid the relatively large defect as described above, the method in which the arrangement between the distributing wiring, that is, between the redundant signal distributing lines 1202 is made at intervals as large as possible, is desirable, and this method is named a distributing method in the specification. On the contrary, the method in which the distributing wiring is arranged at intervals as short as possible is named a concentrating method. When both of the methods are compared, since the wiring length of the distributing wiring is increased in the distributing method, the yield thereof is reduced but the distributing method is advantageous when the relatively large defect tends to occur as described above, whereas the concentrating method has a stable process and accordingly the concentrating method is effective for the design in the product manufacturing stage.

Figure 18:
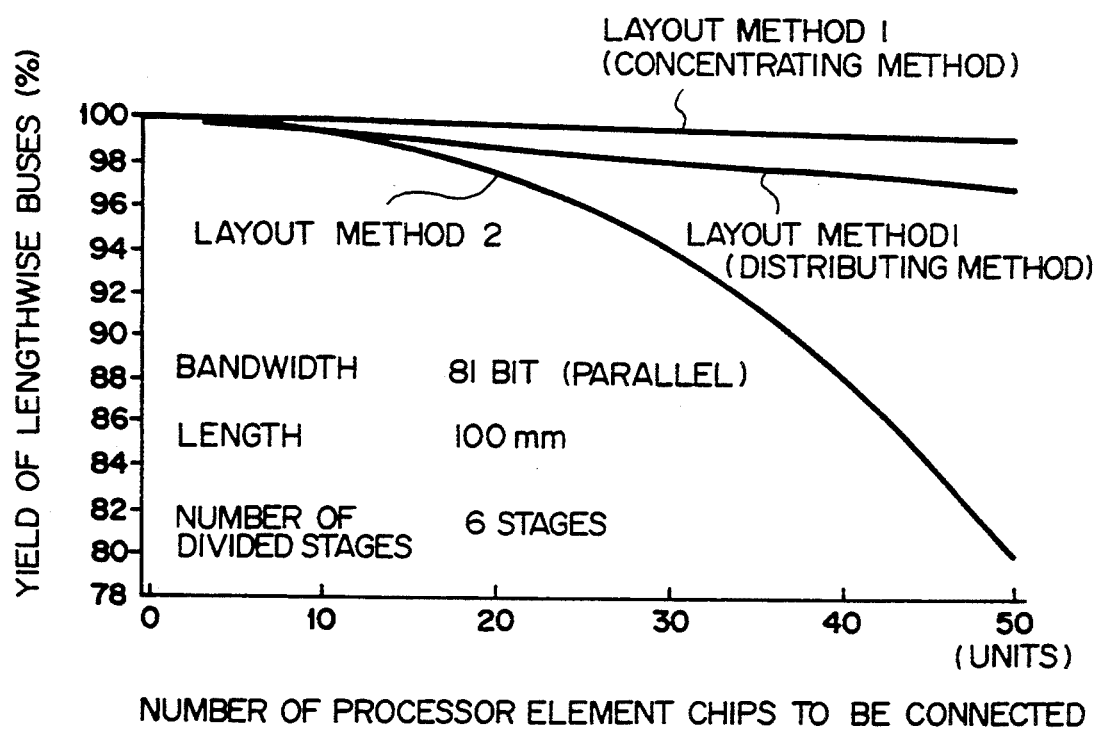
FIG. 18 is a graph showing a comparison in the redundant wiring methods of the present invention.

FIG. 18 is a graph schematically illustrating the yield in the case where the lengthwise buses 801 having a bandwidth of 81 bits, a length of 100 mm and six divided stages corresponding to the number of the processor element chips to be connected, are formed by means of the layout method 1 (concentrating method), the layout method 1 (distributing method) and the layout method 2. The abscissa of FIG. 18 represents the number of processor element chips to be connected and the ordinate represents the yield of the lengthwise buses. The yield is calculated on condition that defects are distributed uniformly and the defect density is one defect per one square centimeter. It is apparent from the graph that when the number of processor element chips to be connected is 30, even the distributing method of the layout method 1 has a yield of 98% or more and is very excellent as the wiring arrangement method.

According to this embodiment, the first effect is that the packaging density is improved and the parallel computer system utilizing the crossbar interconnection network having the bandwidth of 81 bits and the number of processor element chips to be connected of 30 can be compactly mounted (100 mm square). The second effect is that the high yield is attained as the device utilizing WSI.

The first effect is described in detail. The crossbar interconnection network circuit having pins and wirings numbering larger with respect to the number of gates than a conventional logic circuit has the total number of pins of the system which is increased in proportion to the one-half power of the number of chips when the crossbar interconnection network circuit is divided into chips and mounted as the divided chips. The increased total number of pins increases the whole mounting area.

Figure 15:
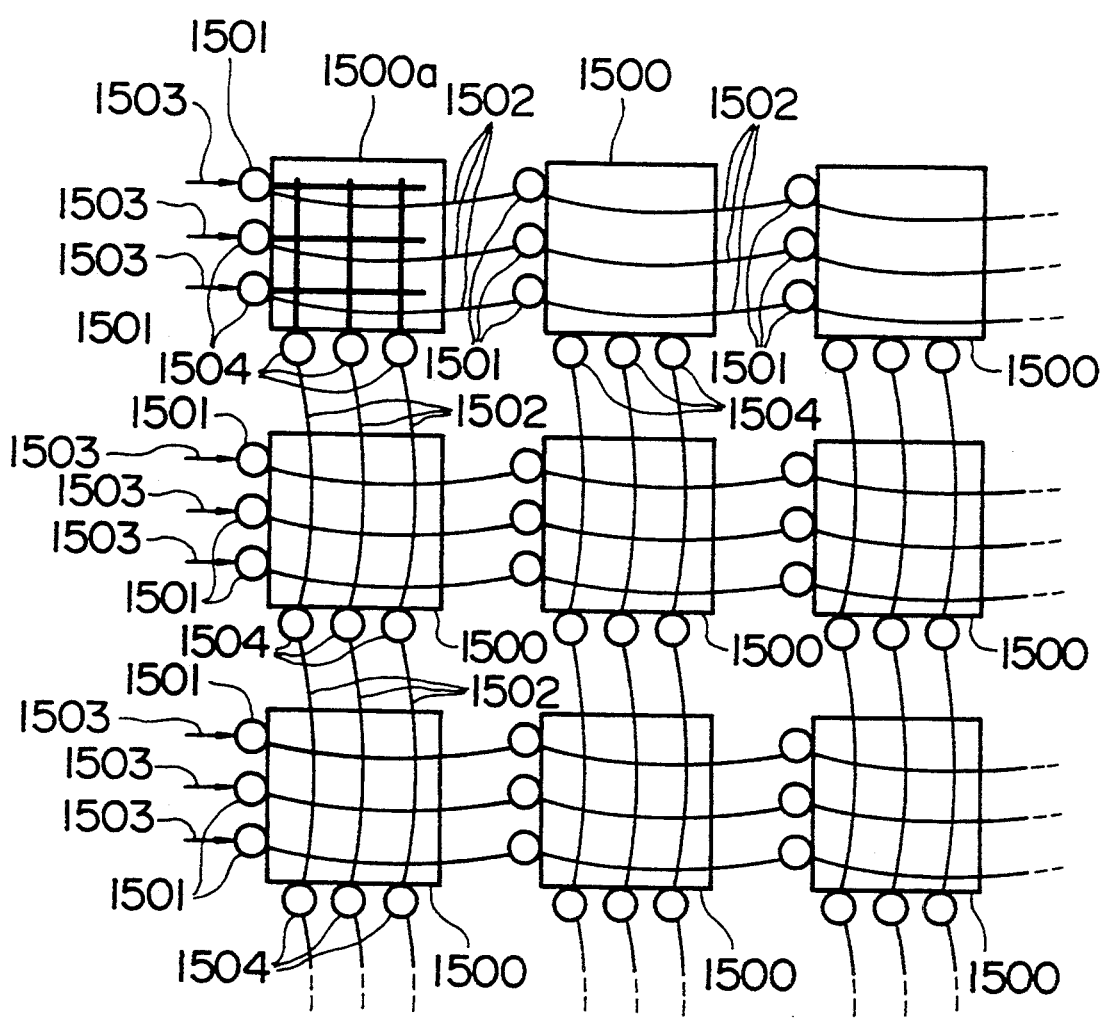
FIG. 15 schematically illustrates a crossbar interconnection network divided into a plurality of sections to be mounted on a chip.

FIG. 15 schematically illustrates the crossbar interconnection network which is divided into chips to be mounted. Only input and output signals of the crossbar interconnection network are considered. The whole crossbar interconnection network is constituted by means of crossbar switch chips 1500a and 1500 having the same size. Input signals 1503 to signal input pins 1501 are applied through connecting wirings 1502 to signal input pins 1501 of the adjacent crossbar switch chip 1500 arranged in the horizontal direction. On the other hand, output signals from signal output pins 1504 are applied through the connecting wirings 1502 to output signal pins 1504 of the crossbar switch chip 1500 arranged in the vertical direction. Similarly, input terminals and output terminals of all crossbar switch chips 1500 are connected. The crossbar switch chip 1500a illustrates the internal configuration of the three-input-and-three-output crossbar switch. In this manner, in the example shown in FIG. 15, the three-input-and-three-output crossbar switch chips 1500 are used to constitute the whole crossbar interconnection network. It should be noted that the number of terminals of an actual crossbar switch chip is increased as compared,with the crossbar switch chip 1500 of FIG. 15 since there are terminals for control signals and power supplies.

Figure 16:
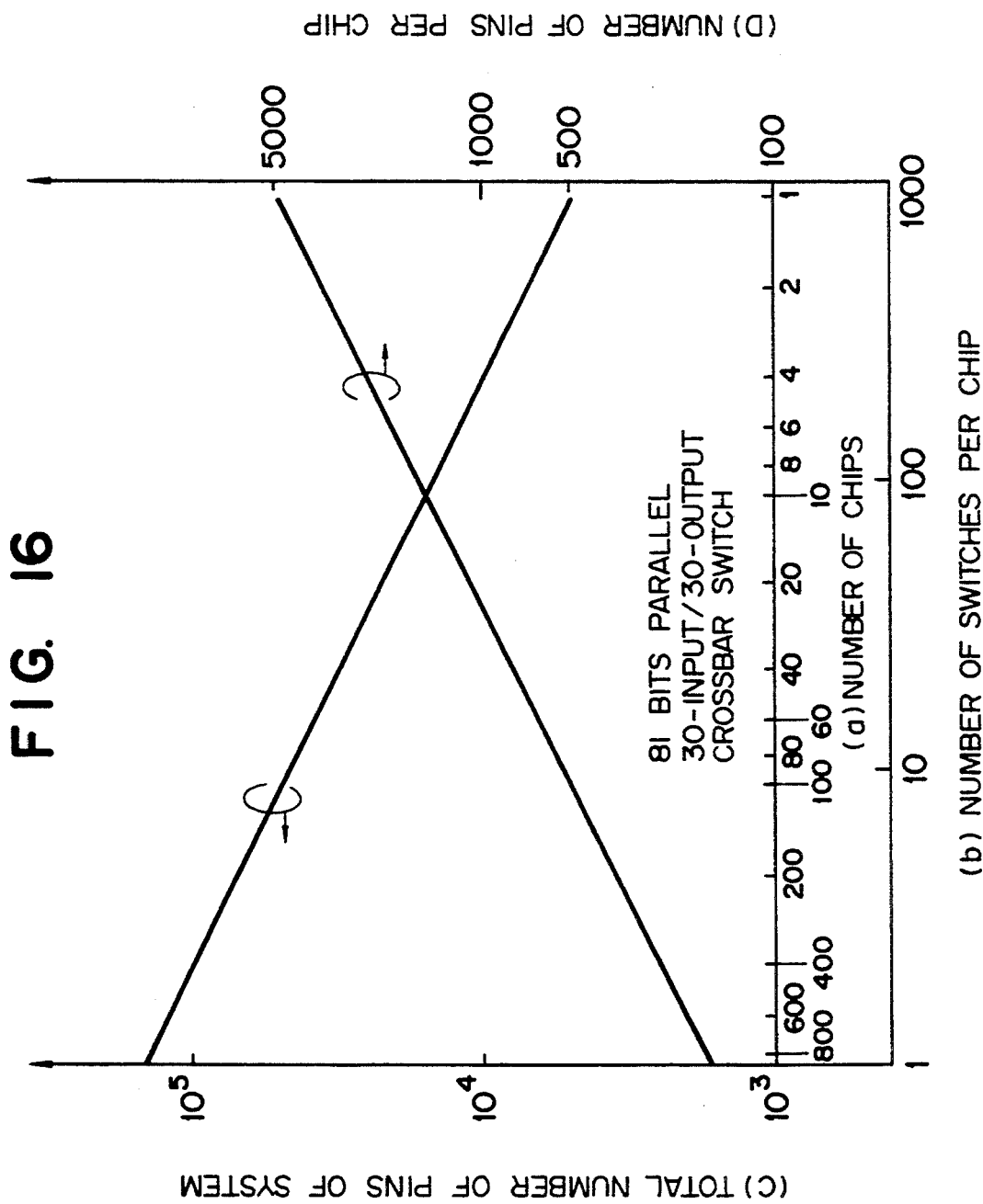
FIG. 16 is a graph showing increased pins due to the division of the crossbar interconnection network.

FIG. 16 is a graph showing the total number of pins and the number of pins per chip in the case where a 30-input-and-30-output crossbar interconnection network having 900 crossbar switches is divided into chips in accordance with the chip division arrangement as described above. However, the bandwidth of one crossbar switch is 81 bits (parallel).

In FIG. 16, the abscissa (a) represents the number of chips, the abscissa (b) the number of crossbar switches per chip, the ordinate (c) the total number of pins of the system, and the ordinate (d) the number of pins per chip.

It is understood that when crossbar switch chips capable of using signal input/output terminals of 500 pins are packaged to constitute a crossbar interconnection network, the total number of chips, the number of crossbar switches per chip and the total number of pins of the system are 100, 9 and about 50000, respectively. On the contrary, in the network WSI 701 of the embodiment, the number of chips represented by the abscissa (a) of FIG. 16 is 1 and the total number of pins of the system is about 5000, and improvement of the packaging density can be confirmed.

The second effect is now described in detail. Heretofore, the system utilizing the WSI is almost of a so-called monolithic type in which all circuits are formed on the WSI. When the system utilizing the WSI is designed, any defect saving countermeasure is required, while a great effort is made to determine the defect saving countermeasure in the monolithic type. On the contrary, since the embodiment utilized the method in which the processor element chips, having a density which is greatly reduced when the redundant design for the defect countermeasure is made, are formed individually as conventional integrated circuit chips and only the chips are mounted and connected on the WSI, it can be considered that the yield of the processor element chips is 100%. Accordingly, the yield of the whole device is decided by the yield of the network WSI 701. Since the crossbar network logic circuits having the defect saving countermeasure which is easily performed and high repeatability are formed on the WSI, and the triplex majority gate signal lines of which the effects have been described in conjunction with FIGS. 17 and 18 are further arranged by the layout method 1, the yield of the network WSI 701 is larger than the conventional WSI and accordingly the yield of the whole device can be increased.

Figure 19:
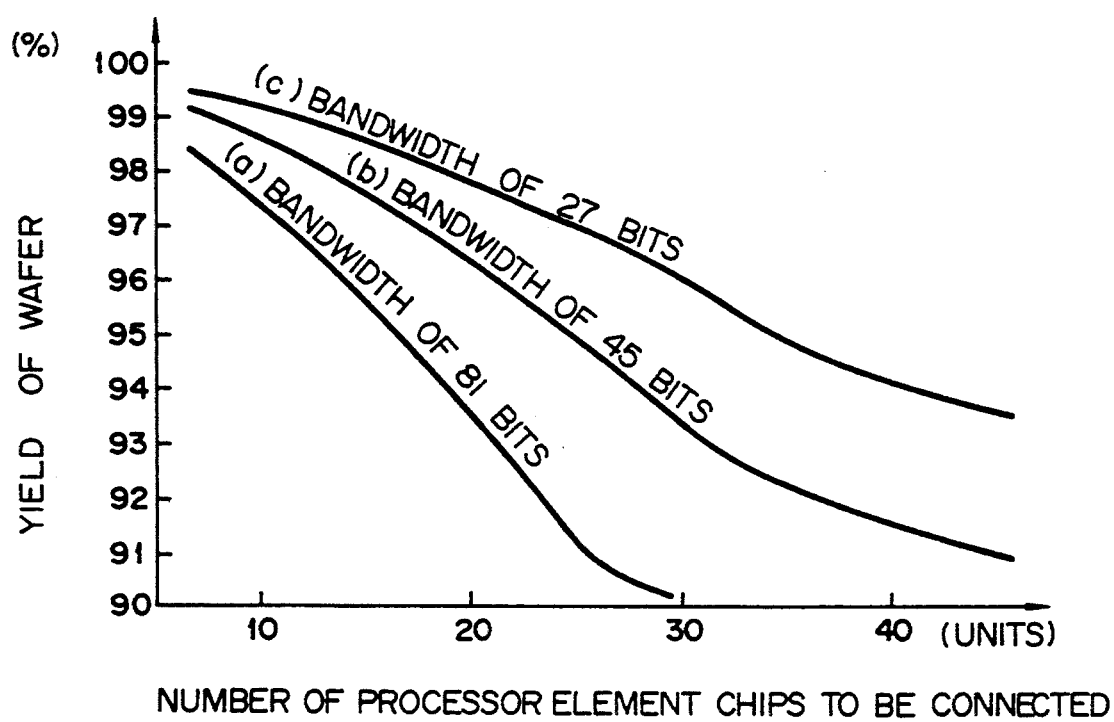
FIG. 19 is a graph for explaining effects of the present invention.

FIG. 19 is a graph showing the wafer yield of the network WSI 701. The wafer yield is a ratio of excellent wafers without defect to all wafers in the case where wafer scale integrated circuits are continued to be manufactured without limitation.

In FIG. 19, the abscissa represents the number of processor element chips mounted and connected on the wafer and the ordinate represents the yield of wafer. In FIG. 19, (a) represents the yield where the bandwidth of one crossbar switch is 81 bits, (b) 45 bits, and (c) 27 bits.

A calculation method of the wafer yield is described simply. It is assumed that defects are distributed uniformly and the defect density is one defect per square centimeter. The WSI of the embodiment has the multilayer structure, while it is assumed that one defect affects all layers thereof. According to an equation (12.3) in page 215 of REVISED INTEGRATED CIRCUIT ENGINEERING (2), Yanai and Nagata, Corona Corp., when an area of a certain portion on an integrated circuit is A and the defect density is $\lambda$, the yield Y of the area is given by $$Y = \exp(-\lambda \times A)$$

When a circuit in a certain area is triplicated by means of the majority circuit, the yield Ym of the area is calculated by the following equations when a yield of a small area having a third area thereof is Yb.

$$Yb = \exp(-\lambda \times A/3)$$

$$Ym = Yb^3 + 3Yb^2(1-Yb)$$

In this embodiment, the triplex majority gate signal lines for the crossbar interconnection network occupy almost all of the area. First of all, a yield $\alpha$ of the triplex majority gate circuit for one bit and one stage shown in FIG. 12A is calculated. When a third of the area of the triplex majority gate circuit for one bit and one stage is s and a yield of the small area s is Ys, $$Ys = \exp(-\lambda \times s)$$

$$\alpha = Ys^3 + 3Ys^3(1-Ys)$$

When the total number in the whole wafer of the triplex majority gate circuits used in the triplex majority gate signal lines of the lengthwise buses 801 is Nbv and the total number in the whole wafer of the triplex majority gate circuits used in the triplex majority gate signal lines of the lateral buses 802a and 802b is Nbh, the yields Ymv and Ymh of the lengthwise triplex majority gate signal lines and the lateral triplex majority gate signal lines, respectively, are given by $$Ymv = \alpha^{Nbv}$$

$$Ymh = \alpha^{Nbh}$$

The product of Ymv and Ymh is the yield of the wafer.

According to FIG. 19, when the bandwidth is 81 bits and the number of processor element chips to be connected is 30, the wafer yield is about 90%. A finite number of wafers are supplied as a lot during trial manufacturing or manufacturing of products. In the specification, the ratio of the number of excellent wafers without defect to the number of supplied wafers is the yield of lot. The yield of lot can be estimated by the normal distribution approximation when the number of supplied wafers exceeds 30 to 50 and by the binomial distribution approximation when the number of supplied wafers is smaller than 30 to 50. When the yield of wafer is 90% and the number of supplied wafers in a lot is 10, the yield of lot is about 50%.

Figure 21:
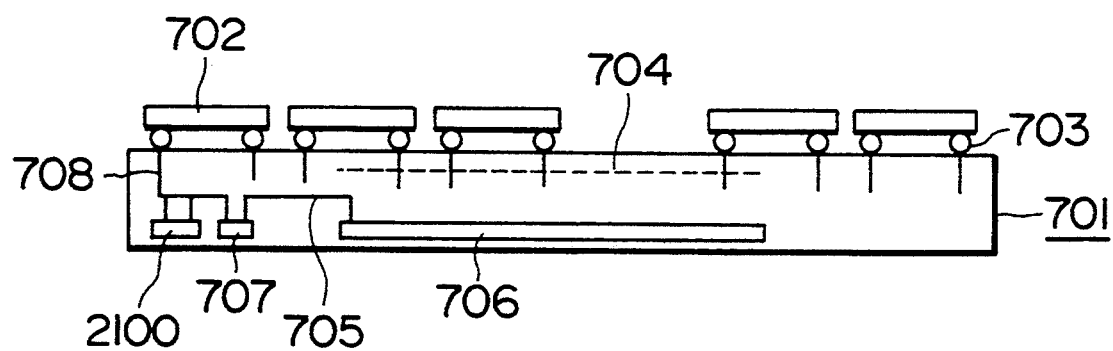
FIG. 21 schematically illustrates another embodiment of a parallel computer system to which the semiconductor integrated circuit device of the present invention is applied.

FIG. 21 schematically illustrates another embodiment of the parallel computer system according to the present invention, which includes the processor element chips 702 mounted on the network WSI 701 and a general-purpose storage unit 2100 provided within the network WSI 701 covered by the processor element chips 702. Other reference numerals in FIG. 21 designate the same elements as those of FIG. 1.

When the general-purpose storage unit 2100 is utilized as the main storage unit of the processor element chips 702, areas on the processor element chips 702 can be utilized by other circuits. Further, since the general-purpose storage unit 2100 can be provided in the vicinity of the input/output buffer storage unit 707, transmission and reception of data between them can be made easily, so that transfer of information by the direct memory access method can be made between the general-purpose storage unit 2100 and the input/output buffer storage unit 707 without intervention of the processor element chips 702. In addition, since the general-purpose storage unit 2100 is easily configured redundantly for the defect saving in the same manner as a general storage unit, the general-purpose storage circuit 2100 is suitable as a circuit which is arranged on a wafer. The general-purpose storage unit 2100 is a so-called regular logic circuit described above.

Figure 22:
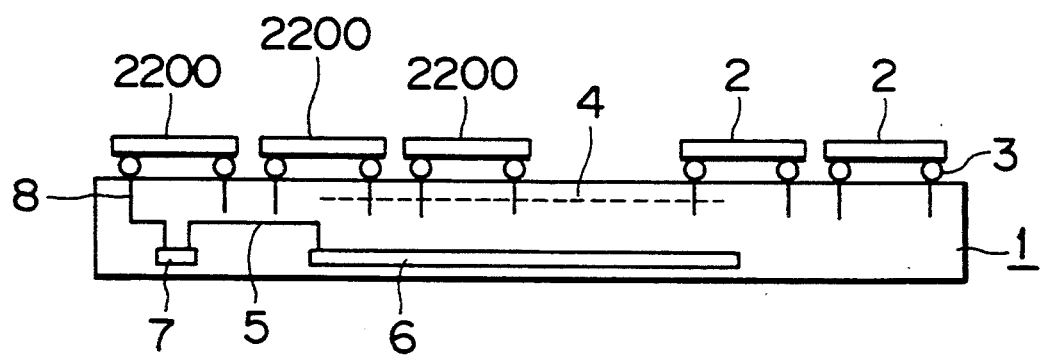
FIG. 22 schematically illustrates still another embodiment of a parallel computer system to which the semiconductor integrated circuit device of the present invention is applied.

FIG. 22 schematically illustrates still another embodiment of the parallel computer system according to the present invention, which includes storage chips 2200 having high function as part of the integrated circuit chips mounted on the network WSI 701 instead of the processor element chips 702. Other reference numerals in FIG. 22 designate the same elements as those of FIG. 1.

The storage chip 2200 having high function includes a storage circuit portion, a storage control circuit portion and a network control circuit portion. The storage circuit portion includes a random access memory having a memory capacity of, for example, 1 Mega byte. The storage control circuit portion performs control of input/output of information to the storage circuit portion and administration of the storage circuit portion. The network control circuit portion controls the input/output of information to the storage circuit portion and administration of the storage circuit portion. The network control circuit portion controls the input/output buffer storage circuit 707 on the network WSI 701 and the storage control circuit portion of the storage chip 2200 having high function and communicates with the crossbar interconnection network on the network WSI 701.

The storage chip 2200 having high function can be used as a common memory accessible from each of the processor element chips 702. The storage circuit portion of the storage chip 2200 is a so-called regular logic circuit.

Furthermore, the network control circuit may be provided in the processor element chip 702.

As described above, application of the semiconductor integrated circuit device according to the present invention provides a parallel operation mechanism which is compact and has a good yield. Further, by interconnecting a plurality of information processing units constituted by such semiconductor integrated circuit devices, the high-density parallel computer system can be constructed. The whole system is sized so that the system does not require a special computer room as in a conventional parallel processor but can be installed in a usual office room or put on a desk in the office room and can attain calculation capability close to a current super computer in fields of technical and scientific calculation, high-speed graphical processing and the like. Further, the system can be provided in a market at a very low price as compared with the current supercomputer.

We claim:

1. A semiconductor integrated circuit device, comprising:
   a plurality of first integrated circuit elements; and
   a second integrated circuit element for mounting said plurality of first integrated circuit elements thereon, including:
   a plurality of wiring conductors provided at a main surface of said second integrated circuit element for transfer of signals along said main surface, wherein each of at least some of said wiring conductors is connected to one of said first integrated circuit elements to receive a signal therefrom or to provide a signal thereto;
   a logic circuit formed at said main surface of said second integrated circuit element connected to at least some of said wiring conductors; and
   a clock signal line provided on the main surface of said second integrated circuit element;
   wherein said logic circuit comprises a plurality of latch circuits formed at different portions of said main surface of said second integrated circuit element for transfer of a signal provided from one of said first integrated circuit elements to another of said first integrated circuit elements;
   wherein said latch circuits are connected to selected plural ones of said plurality of wiring conductors so that said latch circuits are connected in series by said selected wiring conductors;
   wherein one of said selected wiring conductors is connected to said one first integrated circuit element to receive a signal therefrom, and another of said selected wiring conductors is connected to said another first integrated circuit element to transfer a signal thereto; and
   wherein each latch circuit is further connected to said clock signal line so as to transfer a signal provided from a first one of said selected wiring conductors connected to said each latch circuit to a second one of said selected wiring conductors connected to said each latch circuit, in response to a clock signal provided by way of said clock signal line, so that said signal provided by said one first integrated circuit element is transferred to said another first integrated circuit element by way of said latch circuits and said selected wiring conductors in synchronism with said clock signal.

2. A semiconductor integrated circuit device, comprising:
   a plurality of first integrated circuit elements; and
   a second integrated circuit element for mounting said plurality of first integrated circuit elements thereon, including:
   a plurality of first wiring conductors provided on a main surface of said second integrated circuit element for transfer of signals along said main surface, wherein each of at least some of said first wiring conductors is connected to one of said first integrated circuit elements to receive a signal therefrom or to provide a signal thereto;
   a logic circuit formed at said main surface and connected to some of said plurality of first wiring conductors to receive signals therefrom and to another of said plurality of first wiring conductors to provide signals thereto, wherein some of a plurality of circuit elements which constitute said logic circuit are connected to each other by a plurality of second wiring conductors located on said main surface, and others of said circuit elements are connected by some of said first wiring conductors;
   wherein each first wiring conductor has a smaller resistance per unit length than each second wiring conductor included in said logic circuit.

3. A semiconductor integrated circuit device according to claim 2, wherein each first wiring conductor has a greater width and a greater thickness, and is made of material of larger specific conductivity, than each second wiring conductor included in said logic circuit.

4. A semiconductor integrated circuit device according to claim 3, wherein each first wiring conductor is formed through a plating process.

5. A semiconductor integrated circuit device according to claim 3, wherein each first wiring conductor is made of copper and each second wiring conductor is made of aluminum.

6. A semiconductor integrated circuit device, comprising:
   a plurality of first integrated circuit elements; and
   a second integrated circuit element for mounting said plurality of first integrated circuit elements thereon, including:
   a plurality of first wiring conductors provided at a main surface of said second integrated circuit element for transfer of signals along said main surface, wherein each of at least some of said first wiring conductors is connected to one of said first integrated circuit elements to receive a signal therefrom or to provide a signal thereto;
   a plurality of logic circuits formed at said main surface, each connected to ones of said plurality of first wiring conductors to receive signals therefrom or to provide signals thereto;
   wherein a first ratio of an area of a first regular logic circuit portion formed in said second integrated circuit element to a whole area of said second integrated circuit element is larger than a second ratio of an area of a second regular logic circuit portion formed in one of said first integrated circuit elements to a whole area of said one of said first integrated circuit elements; and
   wherein each of said first regular logic circuit portion of said second integrated circuit element and said second regular logic circuit portion of said one of said first integrated circuit elements includes a plurality of circuit portions which have a same circuit configuration and are positioned regularly integrated circuit elements constitutes an instruction 7. A semiconductor integrated circuit device, comprising:
   a plurality of first integrated circuit elements; and
   a second integrated circuit element for mounting said plurality of first integrated circuit elements thereon, including:
   a plurality of first wiring conductors provided at a main surface of said second integrated circuit element for transfer of signals along said main surface, wherein each of at least some of said first wiring conductors is connected to one of said first integrated circuit elements to receive a signal therefrom or to provide a signal thereto; and
   a first logic circuit formed at said main surface and connected to said plurality of first conductors to receive a signal therefrom and to another of said plurality of first wiring conductors to provide a signal thereto;
   wherein each of at least some of said first integrated circuit elements constitutes an instruction processing unit and each of said some of said first integrated circuit elements is connected to some of said first wiring conductors at plural points on said main surface for transferring signals thereto or therefrom; and
   wherein said first logic circuit of said second integrated circuit element is shared by a plurality of instruction processing units constituted by said some of said first integrated circuit elements.

8. A semiconductor integrated circuit device according to claim 7, wherein some of a plurality of circuit elements which constitute said first logic circuit are connected to each other by a plurality of second wiring conductors located on said main surface, and others of said circuit elements which constitute said first logic circuit are connected to each other by some of said first wiring conductors;
   wherein each first wiring conductor has a smaller resistance per unit length than each second wiring conductor.

9. A semiconductor integrated circuit device according to claim 8, wherein each first wiring conductor has a greater width and a greater thickness, and is made of material of larger specific conductivity, than each second wiring conductor included in said first logic circuit.

10. A semiconductor integrated circuit device according to claim 9, wherein said first wiring conductors are formed through a plating process.

11. A semiconductor integrated circuit device according to claim 9, wherein each first wiring conductor is made of copper, and each second wiring conductor is made of aluminum.

12. A semiconductor integrated circuit device according to claim 7, wherein said signals transferred between said plurality of instruction processing units and said some of said first wiring conductors include access requests provided by said instruction processing units for a main storage and an I/O device, data to be written into said main memory or said I/O device, and data read out of said main memory or said I/O device, said main memory and said I/O device being shared by said plurality of instruction processing units and being connected to some of said first wiring conductors at terminals provided on said second integrated circuit element; and
   wherein said first logic circuit constitutes a system control unit for controlling transfer of signals provided onto some of said first wiring conductors from said plurality of instruction processing units constituted by said some of said first integrated circuit elements to said main memory and said I/O device by way of some of said first wiring conductors, and for controlling transfer of signals provided on some of said first wiring conductors from said main memory and said I/O device to said some of said instruction processing units by way of some of said first wiring conductors.

13. A semiconductor integrated circuit device according to claim 12, wherein said second integrated circuit element further includes a second logic circuit which realizes a cache memory unit for said main memory unit;
   wherein said cache memory unit is shared by said plurality of instruction processing units; and
   wherein said system control unit includes a circuit portion for controlling transfer of signals between said main memory portion and said cache memory unit and between said cache memory unit and said plurality of instruction processing units.

14. A semiconductor integrated circuit device according to claim 12, wherein some of a plurality of circuit elements which constitute said system control unit are connected to each other by a plurality of second wiring conductors located on said main surface, and others of said circuit elements which constitute said system control unit are connected to each other by some of said first wiring conductors;
   wherein each first wiring conductor has a smaller resistance per unit length than each second wiring conductor.

15. A semiconductor integrated circuit device according to claim 14, wherein each first wiring conductor has a greater width and a greater thickness, and is made of material of larger specific conductivity, than each second wiring conductor included in said first logic circuit.

16. A semiconductor integrated circuit device according to claim 15, wherein said first wiring conductors are formed through a plating process.

17. A semiconductor integrated circuit device according to claim 15, wherein each first wiring conductor is made of copper, and each second wiring conductor is made of aluminum.

18. A semiconductor integrated circuit device according to claim 7, wherein said first logic circuit constitutes a network in combination with said first wiring conductors for transfer of signals between said plurality of instruction processing units.

* * * * *